United States Patent
van Bentum et al.

(10) Patent No.: US 9,293,556 B2
(45) Date of Patent: Mar. 22, 2016

(54) SEMICONDUCTOR STRUCTURE INCLUDING A FERROELECTRIC TRANSISTOR AND METHOD FOR THE FORMATION THEREOF

(71) Applicant: GLOBALFOUNDRIES Inc., Grand Cayman (KY)

(72) Inventors: Ralf van Bentum, Moritzburg (DE); Jongsin Yun, Austin, TX (US); Seunghwan Seo, Dresden (DE); Joerg Schmid, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 3 days.

(21) Appl. No.: 14/445,893

(22) Filed: Jul. 29, 2014

(65) Prior Publication Data

US 2016/0035856 A1 Feb. 4, 2016

(51) Int. Cl.
*H01L 21/00* (2006.01)
*H01L 29/51* (2006.01)
*H01L 27/088* (2006.01)
*H01L 21/28* (2006.01)

(52) U.S. Cl.
CPC ........ *H01L 29/516* (2013.01); *H01L 21/28158* (2013.01); *H01L 27/088* (2013.01); *H01L 29/513* (2013.01); *H01L 29/517* (2013.01)

(58) Field of Classification Search
CPC ... H01L 29/516; H01L 29/513; H01L 29/517; H01L 27/088; H01L 21/28158
See application file for complete search history.

(56) References Cited

U.S. PATENT DOCUMENTS

| | | | |
|---|---|---|---|
| 2011/0014757 A1* | 1/2011 | Zhu | H01L 27/11526 438/211 |
| 2012/0083110 A1* | 4/2012 | Huguenin | H01L 21/28088 438/591 |
| 2012/0083111 A1* | 4/2012 | Lim | H01L 21/32134 438/591 |
| 2013/0234254 A1* | 9/2013 | Ng | H01L 21/823857 257/369 |
| 2013/0270619 A1 | 10/2013 | Schloesser et al. | |
| 2014/0264626 A1* | 9/2014 | Yan | H01L 21/823857 257/392 |
| 2015/0060983 A1* | 3/2015 | Lusetsky | H01L 29/66825 257/316 |

* cited by examiner

*Primary Examiner* — A. Sefer
(74) *Attorney, Agent, or Firm* — Amerson Law Firm, PLLC

(57) ABSTRACT

An illustrative semiconductor structure described herein includes a substrate including a logic transistor region, a ferroelectric transistor region and an input/output transistor region. A logic transistor is provided at the logic transistor region. The logic transistor includes a gate dielectric and a gate electrode. An input/output transistor is provided at the input/output transistor region. The input/output transistor includes a gate dielectric and a gate electrode. The gate dielectric of the input/output transistor has a greater thickness than the gate dielectric of the logic transistor. A ferroelectric transistor is provided at the ferroelectric transistor region. The ferroelectric transistor includes a ferroelectric dielectric and a gate electrode. The ferroelectric dielectric is arranged between the ferroelectric transistor region and the gate electrode of the ferroelectric transistor.

11 Claims, 13 Drawing Sheets

SEMICONDUCTOR STRUCTURE INCLUDING A FERROELECTRIC TRANSISTOR AND METHOD FOR THE FORMATION THEREOF

BACKGROUND OF THE INVENTION

1. Field of the Invention

The present disclosure generally relates to integrated circuits, and, more particularly, to integrated circuits including transistors having a ferroelectric dielectric in addition to other transistors, such as logic transistors and/or input/output transistors.

2. Description of the Related Art

Integrated circuits typically include a large number of circuit elements which include, in particular, field effect transistors. The circuit elements in an integrated circuit may be electrically connected by means of electrically conductive metal lines formed in an interlayer dielectric material. The electrically conductive metal lines may be provided in a plurality of interconnect layers that are stacked on top of each other above a substrate in and on which circuit elements, such as field effect transistors, and other circuit elements, such as capacitors, diodes and resistors, are formed. Metal lines in different interconnect layers may be electrically connected with each other by means of contact vias that are filled with metal.

Integrated circuits may include nonvolatile memory. In some types of nonvolatile memory, so-called ferroelectric transistors (FeFETs) may be employed. Ferroelectric transistors may include a gate electrode that is formed above a channel region provided between a source region and a drain region. A layer of a ferroelectric material is arranged between the gate electrode and the channel region. An electrical conductivity of the channel region of the ferroelectric transistor may be controlled by an electrical field that acts on the channel region. In addition to an electrical field that is created by applying a gate voltage to the gate electrode of the ferroelectric transistor, an electrical field caused by a ferroelectric polarization of the layer of ferroelectric material arranged between the gate electrode and the channel region may also act on the channel region of the ferroelectric transistor.

Depending on the direction of the ferroelectric polarization of the ferroelectric dielectric, the electrical field created by the ferroelectric polarization of the ferroelectric dielectric may have a substantially same direction as the electrical field created by the application of the gate voltage to the gate electrode, or the electrical field created by the ferroelectric polarization of the ferroelectric dielectric and the electrical field created by the application of the gate voltage to gate electrode may have substantially opposite directions.

If both electrical fields have substantially the same direction, a threshold voltage that needs to be applied to the gate electrode for switching the ferroelectric transistor into the electrically conductive state (for ferroelectric transistors being N-channel transistors, the transistor is switched into the electrically conductive state by applying the gate voltage) may be reduced, and the electrical conductivity of the channel region that is obtained when a particular gate voltage greater than the threshold voltage is applied may be increased. If both electrical fields have opposite directions, the threshold voltage of the ferroelectric transistor may be increased, and the electrical conductivity of the channel region that is obtained when a particular gate voltage greater than the threshold voltage is applied may be reduced.

The ferroelectric polarization of the ferroelectric dielectric may be influenced by applying a programming voltage between the gate electrode and the channel region. For example, the programming voltage may be applied to the gate electrode, and the source region, the drain region and, optionally, the body of the ferroelectric transistor may be maintained at mass potential. The programming voltage may be positive or negative, depending on the desired direction of the ferroelectric polarization of the ferroelectric dielectric. The ferroelectric polarization of the ferroelectric dielectric may be maintained even if the programming voltage is no longer applied. Thus, a bit of data may be stored in the ferroelectric transistor, wherein a first polarization direction of the ferroelectric dielectric may be identified with a logical 0, and a second polarization direction of the ferroelectric dielectric may be identified with a logical 1.

For reading the stored bit of data from the ferroelectric transistor, a gate voltage may be applied between the gate electrode and the source region of the ferroelectric transistor, wherein the gate voltage applied during the reading of the bit of data is typically lower than the programming voltage, so that the ferroelectric polarization of the ferroelectric dielectric is substantially not changed. Then, the electric current flowing through the ferroelectric transistor may be measured for determining the direction of the ferroelectric polarization of the ferroelectric dielectric.

For some applications, it may be desirable to form ferroelectric transistors and field effect transistors of other types on a same semiconductor substrate. For example, U.S. Patent Publication No. 2013/0270619 discloses a method wherein a high-k dielectric layer is formed above a first active region and a second active region so as to serve as a ferroelectric layer. The high-k dielectric layer is removed from above the first active region. The high-k dielectric layer is preserved above the second active region. A first electrode structure is formed above the first active region and a second electrode structure is formed above the second active region.

The present disclosure provides semiconductor structures and methods for the manufacturing thereof which provide an improved integration of ferroelectric transistors on a same semiconductor structure as other types of transistors.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative semiconductor structure described herein includes a substrate including a logic transistor region, a ferroelectric transistor region and an input/output transistor region. A logic transistor is provided at the logic transistor region. The logic transistor includes a gate dielectric and a gate electrode. An input/output transistor is provided at the input/output transistor region. The input/output transistor includes a gate dielectric and a gate electrode. The gate dielectric of the input/output transistor has a greater thickness than the gate dielectric of the logic transistor. A ferroelectric transistor is provided at the ferroelectric transistor region. The ferroelectric transistor includes a ferroelectric dielectric and a gate electrode. The ferroelectric dielectric is arranged between the ferroelectric transistor region and the gate electrode of the ferroelectric transistor.

An illustrative method described herein includes providing a semiconductor structure including a logic transistor region, a ferroelectric transistor region and an input/output transistor region. An input/output transistor dielectric is formed over at least the input/output transistor region and the logic transistor region. The input/output transistor dielectric is removed from at least the logic transistor region. After removing the input/output transistor dielectric from at least the logic transistor region, a logic transistor dielectric is deposited over the semiconductor structure and a first metal is deposited over the logic transistor dielectric. The logic transistor dielectric and the first metal are removed from the ferroelectric transistor region. A ferroelectric transistor dielectric is formed over the ferroelectric transistor region.

Another illustrative method described herein includes providing a semiconductor structure. The semiconductor structure includes a first transistor region, a second transistor region and a silicon dioxide layer on the first transistor region and the second transistor region. A layer of a high-k dielectric material is deposited on the silicon dioxide layer. A layer of a first metal is formed over the second transistor region. The layer of first metal does not cover the first transistor region. After the formation of the layer of the first metal, a layer of a second metal is deposited over the first transistor region and the second transistor region. An annealing process is performed. The annealing process initiates a scavenging reaction between the second metal and silicon dioxide from a portion of the silicon dioxide layer on the first transistor region. After the annealing process, a ferroelectric transistor dielectric is formed over the first transistor region.

A further illustrative method described herein includes providing a semiconductor structure. The semiconductor structure includes a logic transistor region, a ferroelectric transistor region and an input/output transistor region. A logic transistor dummy gate structure is formed over the logic transistor region. A ferroelectric transistor dummy gate structure is formed over the ferroelectric transistor region. An input/output transistor dummy gate structure is formed over the input/output transistor region. The semiconductor structure further includes an electrically insulating structure annularly enclosing each of the logic transistor dummy gate structure, the ferroelectric transistor dummy gate structure and the input/output transistor dummy gate structure. The logic transistor dummy gate structure, the ferroelectric transistor dummy gate structure and the input/output transistor dummy gate structure are exposed at a surface of the electrically insulating structure. The method further includes performing a ferroelectric transistor replacement gate process. The ferroelectric transistor replacement gate process includes removing the ferroelectric transistor dummy gate structure. The removal of the ferroelectric transistor dummy gate structure forms a recess in the electrically insulating structure. A portion of the ferroelectric transistor region is exposed at the bottom of the recess. A ferroelectric transistor dielectric and a metal are deposited over the semiconductor structure. A planarization process is performed to remove portions of the ferroelectric transistor dielectric and the metal outside the recess.

BRIEF DESCRIPTION OF THE DRAWINGS

The disclosure may be understood by reference to the following description taken in conjunction with the accompanying drawings, in which like reference numerals identify like elements, and in which.

Figure 1:
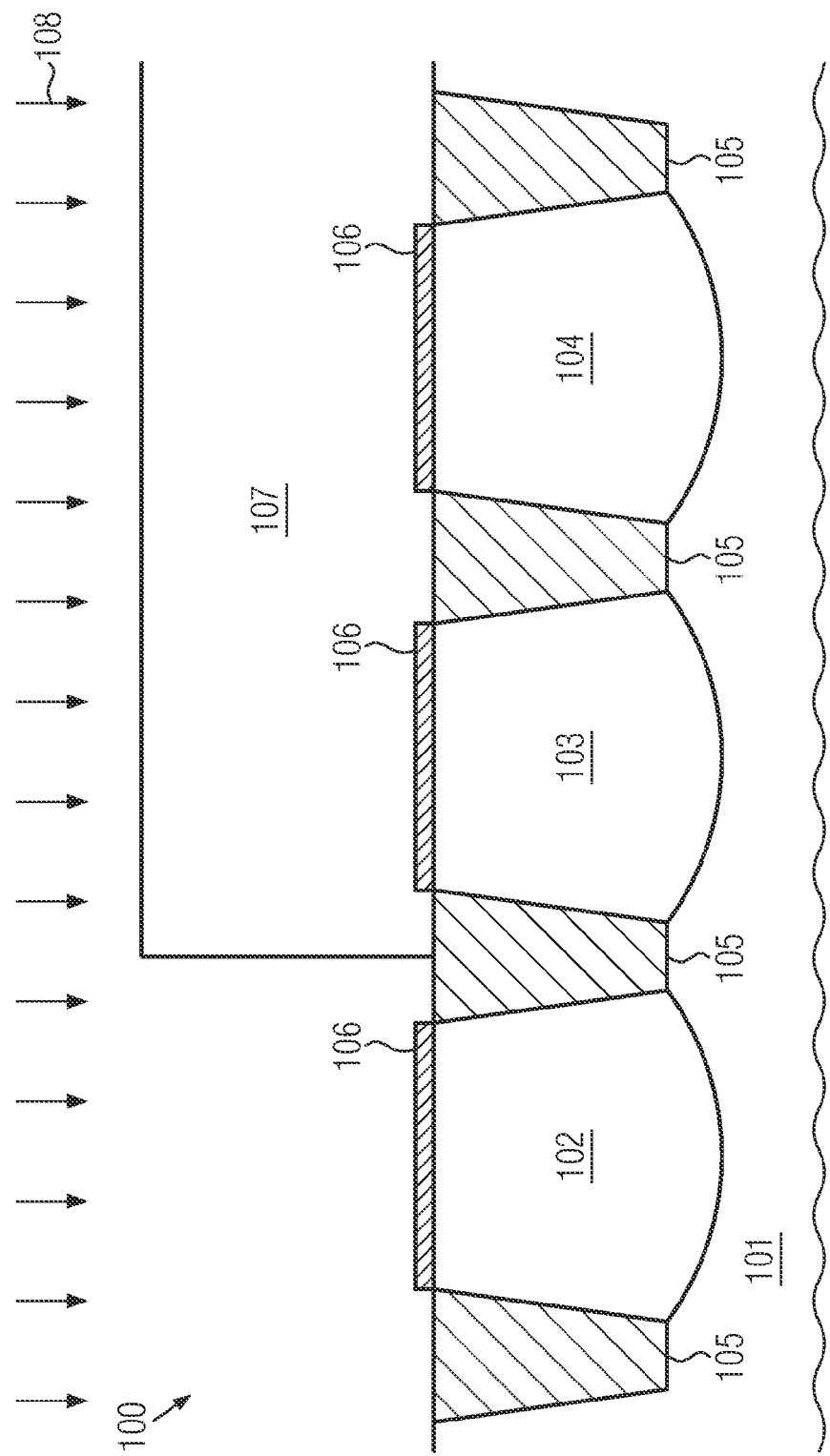
FIGS. 1-5 show schematic cross-sectional views of a semiconductor structure according to an embodiment in stages of a manufacturing process according to an embodiment.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Embodiments described herein relate to an integration scheme for a ferroelectric field effect transistor (FeFET) device into a high-k metal gate complementary metal oxide semiconductor (HKMG CMOS) process flow together with two different other gate oxide types. The other two gate oxide types typically represent gate oxides used in standard logic field effect transistors and gate oxides used in input/output field effect transistors that are adapted for operation at a higher voltage than logic field effect transistors. Embodiments disclosed herein may allow avoiding a modification of the topography for logic field effect transistors, field effect transistors employed in static random access memory (SRAM) devices and input/output devices compared to process of record process (POR) flows. Furthermore, in some embodiments, an exposure of the ferroelectric gate oxide to processes employed in the formation of the gate oxide of logic field effect transistors and input/output field effect transistors, as well as the corresponding metal gate processing and anneals, may be avoided.

In some embodiments, a protection layer may be employed for removing a FeFET stack from the metal gate of other devices.

While, in some embodiments, a gate first integration scheme may be used, in other embodiments, a replacement gate process integration may be employed.

Further embodiments, which may also be combined with features of other embodiments described herein, relate to methods wherein a scavenging material on top of a high-k oxide is used for thinning an interfacial oxide, and which is compatible with the use of ferroelectric field effect transistors. A metal layer may be employed for thinning the interfacial oxide without changing the composition of the gate oxide layer of the ferroelectric field effect transistor.

FIG. 1 shows a schematic cross-sectional view of a semiconductor structure 100 according to an embodiment in a stage of a manufacturing process according to an embodiment. The semiconductor structure 100 includes a substrate 101. In some embodiments, the substrate 101 may be a bulk semiconductor substrate formed of a semiconductor material such as, for example, silicon. In other embodiments, the substrate 101 may be a semiconductor-on-insulator (SOI) substrate that includes a layer of a semiconductor material such as, for example, silicon, at which devices such as field effect transistors of the semiconductor structure 100 are formed, and which is provided on a layer of an insulating material such as, for example, silicon dioxide (not shown). The layer of insulating material may be provided on a support substrate which may, for example, be a silicon wafer (not shown).

The substrate 101 may include a logic transistor region 102, a ferroelectric transistor region 103 and an input/output transistor region 104. As will be detailed in the following, a logic transistor, being a field effect transistor which may be part of logical circuitry of the semiconductor structure 100, will be formed in the logic transistor region 102. In the ferroelectric transistor region 103, a ferroelectric transistor, being a field effect transistor including a gate insulation material including a ferroelectric material, will be formed. In the input/output transistor region 104, an input/output transistor of the semiconductor structure 100, being a field effect transistor that is configured for operation at a higher voltage of operation than the logic transistor to be formed in the logic transistor region 102, will be formed.

Each of the logic transistor region 102, the ferroelectric transistor region 103 and the input/output transistor region 104 may have a doping that is different from a base doping of the substrate 101. For example, in each of the logic transistor region 102, the ferroelectric transistor region 103 and/or the input/output transistor region 104, a respective well region may be provided. This may be done by means of conventional doping techniques such as, for example, ion implantation.

The semiconductor structure 100 may further include a shallow trench isolation structure 105 that provides electrical insulation between the logic transistor region 102, the ferroelectric transistor region 103 and the input/output transistor region 104, and between each of the logic transistor region 102, the ferroelectric transistor region 103, the input/output transistor region 104 and other circuit elements (not shown) in the semiconductor structure 100. For forming the shallow trench isolation structure 105, known techniques for providing shallow trench isolation structures, including photolithography, etching, oxidation, deposition and/or chemical-mechanical polishing, may be employed.

In the stage of the manufacturing process illustrated in FIG. 1, the semiconductor structure 100 further includes an input/output transistor dielectric 106 on each of the logic transistor region 102, the ferroelectric transistor region 103 and the input/output transistor region 104. The input/output transistor dielectric 106 may include an electrically insulating material such as, for example, silicon dioxide, and may be formed by means of techniques such as, for example, thermal oxidation and/or deposition techniques, such as chemical vapor deposition (CVD) and/or plasma enhanced chemical vapor deposition (PECVD). A thickness of the input/output transistor dielectric 106 may be adapted such that the input/output transistor dielectric 106 may be employed in a gate insulation layer of the input/output transistor to be formed in the input/output transistor region 104. For example, the input/output transistor dielectric 106 may be a silicon dioxide layer having a thickness of about 20 Å or more, in particular a thickness in a range from about 20-70 Å.

After the formation of the input/output transistor dielectric 106, a mask 107 may be formed over the ferroelectric transistor region 103 and the input/output transistor region 104. The mask 107 may be a photoresist mask and may be formed using techniques of photolithography. The mask 107 may cover the ferroelectric transistor region 103 and the input/output transistor region 104 but not the logic transistor region 102, so that the portion of the input/output transistor dielectric 106 provided on the logic transistor region 102 is exposed at the surface of the semiconductor structure 100.

After the formation of the mask 107, an etch process adapted for selectively removing the material of the input/output transistor dielectric 106 relative to the semiconductor material of the substrate 101 may be performed, as schematically illustrated by arrows 108 in FIG. 1. In some embodiments, in particular in embodiments wherein the input/output transistor dielectric 106 includes silicon dioxide and the semiconductor material of the substrate 101 includes silicon, the etch process 108 may be a wet etch process wherein diluted hydrofluoric acid is used as an etchant. In other embodiments, the etch process 108 may be a dry etch process.

Figure 2:
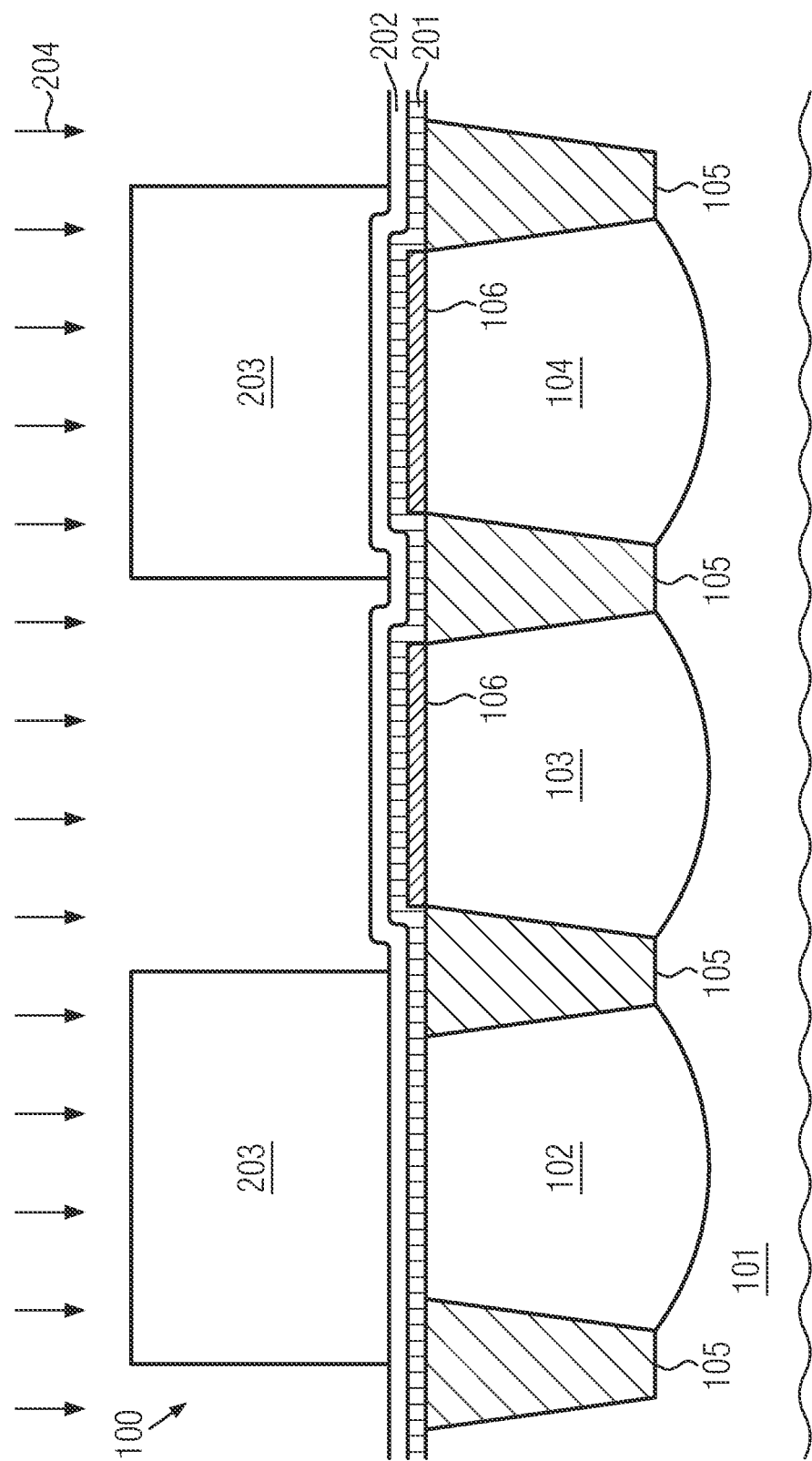

FIG. 2 shows a schematic cross-sectional view of the semiconductor structure 100 in a later stage of the manufacturing process. After the etch process 108, the mask 107 may be removed by means of a resist strip process. Thereafter, a logic transistor dielectric 201 may be formed over the semiconductor structure 100. In the stage of the manufacturing process illustrated in FIG. 2, the logic transistor dielectric 201 may cover the entire semiconductor structure 100. The logic transistor dielectric 201 may include a high-k dielectric material such as, for example, hafnium dioxide. In some embodiments, the logic transistor dielectric 201 may include a layer of high-k dielectric material that is provided on a base layer, which may include silicon dioxide. The logic transistor dielectric 201, when including a high-k dielectric material, need not include hafnium dioxide. In other embodiments, other high-k dielectric materials having a dielectric constant greater than a dielectric constant of silicon dioxide, for example a dielectric constant greater than about four, may be employed, such as, for example, zirconium dioxide, hafnium silicate and/or zirconium silicate.

For forming the logic transistor dielectric 201, deposition techniques, such as, for example, CVD, PECVD, metal organic chemical vapor deposition and/or atomic layer deposition (ALD), may be employed for depositing the layer of high-k dielectric material. In embodiments wherein the logic transistor dielectric 201 additionally includes a base layer of silicon dioxide, the base layer may be formed by means of deposition techniques such as CVD and/or PECVD. In other embodiments, a base layer of silicon dioxide may be formed at the bottom of the logic transistor dielectric 201 at the logic transistor region 102 by means of a thermal oxidation process. At the input/output transistor region 104, this thermal oxidation process may create silicon dioxide at the bottom of the input/output transistor dielectric 106.

In later stages of the manufacturing process, which will be detailed below, a portion of the logic transistor dielectric 201 over the logic transistor region 102 will provide a gate insulation layer of the logic transistor formed at the logic transistor region 102, and portions of the input/output transistor dielectric 106 as well as the logic transistor dielectric 201 formed over the input/output transistor region 104 will provide a gate insulation layer of the input/output transistor formed at the input/output transistor region 104. The gate insulation layer of the input/output transistor, which includes both the input/output transistor dielectric 106 and the logic transistor dielectric 201 may withstand greater voltages of operation as applied to the input/output transistor in the operation of the integrated circuit formed from the semiconductor structure 100 than the gate insulation layer of the logic transistor that does not include the input/output transistor dielectric 106.

After the formation of the logic transistor dielectric 201, a first metal 202 may be deposited over the semiconductor structure 100. Herein, the term "metal" will generally be used to denote elementary metals, metal alloys and metal compounds. The first metal 202 may include a metal, a metal alloy and/or a metal compound suitable for use as a metal gate of the logic transistor to be formed at the logic transistor region 102 and the input/output transistor to be formed at the input/output transistor region 104. In embodiments wherein the logic transistor to be formed at the logic transistor region 102 and the input/output transistor to be formed at the input/output transistor region 104 are P-channel transistors, the first metal 202 may include aluminum and/or aluminum nitride. In embodiments wherein the logic transistor and the input/output transistor are N-channel transistors, the first metal 202 may include lanthanum, lanthanum nitride and/or titanium nitride.

The logic transistor and the input/output transistor need not be transistors of the same type. In some embodiments, one of the logic transistor and the input/output transistor may be an N-channel transistor, and the other of the logic transistor and the input/output transistor may be a P-channel transistor. In such embodiments, portions of the first metal 202 over the logic transistor region 102 and the input/output transistor region 104, respectively, may include different materials. In such embodiments, layers of different metals may subsequently be deposited over the semiconductor structure 100, and techniques of photolithography and etching may be employed for removing portions of the metal layers from the logic transistor region 102, the input/output transistor region 104 and, optionally, the ferroelectric transistor region 103.

In some embodiments, after the formation of the first metal 202, an annealing process may be performed for obtaining a diffusion of the first metal 202. In some embodiments, the first metal 202 may then be removed and replaced with another metal, for example titanium nitride, which is provided both over N-channel transistors and over P-channel transistors. In the following, such a replacement metal will also be denoted as "first metal 202". Hence, in the following, the first metal 202 may represent both the originally deposited first metal 202, and, in embodiments wherein the original first metal is replaced with another metal, the replacement metal.

After the formation of the first metal 202, a mask 203 may be formed over the semiconductor structure 100. The mask 203 may be a photoresist mask and may be formed using techniques of photolithography. The mask 203 may cover the logic transistor region 102 and the input/output transistor region 104, but not the ferroelectric transistor region 103, so that the portion of the first metal 202 formed over the ferroelectric transistor region 103 is exposed at the surface of the semiconductor structure 100.

Thereafter, one or more etch processes adapted for removing the portions of the first metal 202, the logic transistor dielectric 201 and the input/output transistor dielectric 106 over the ferroelectric transistor region 103 may be performed. In FIG. 2, the one or more etch processes are schematically denoted by arrows 204. The one or more etch processes may include known wet or dry etch processes adapted for removing the respective materials of the first metal 202, the logic transistor dielectric 201 and the input/output transistor dielectric 106.

Figure 3:
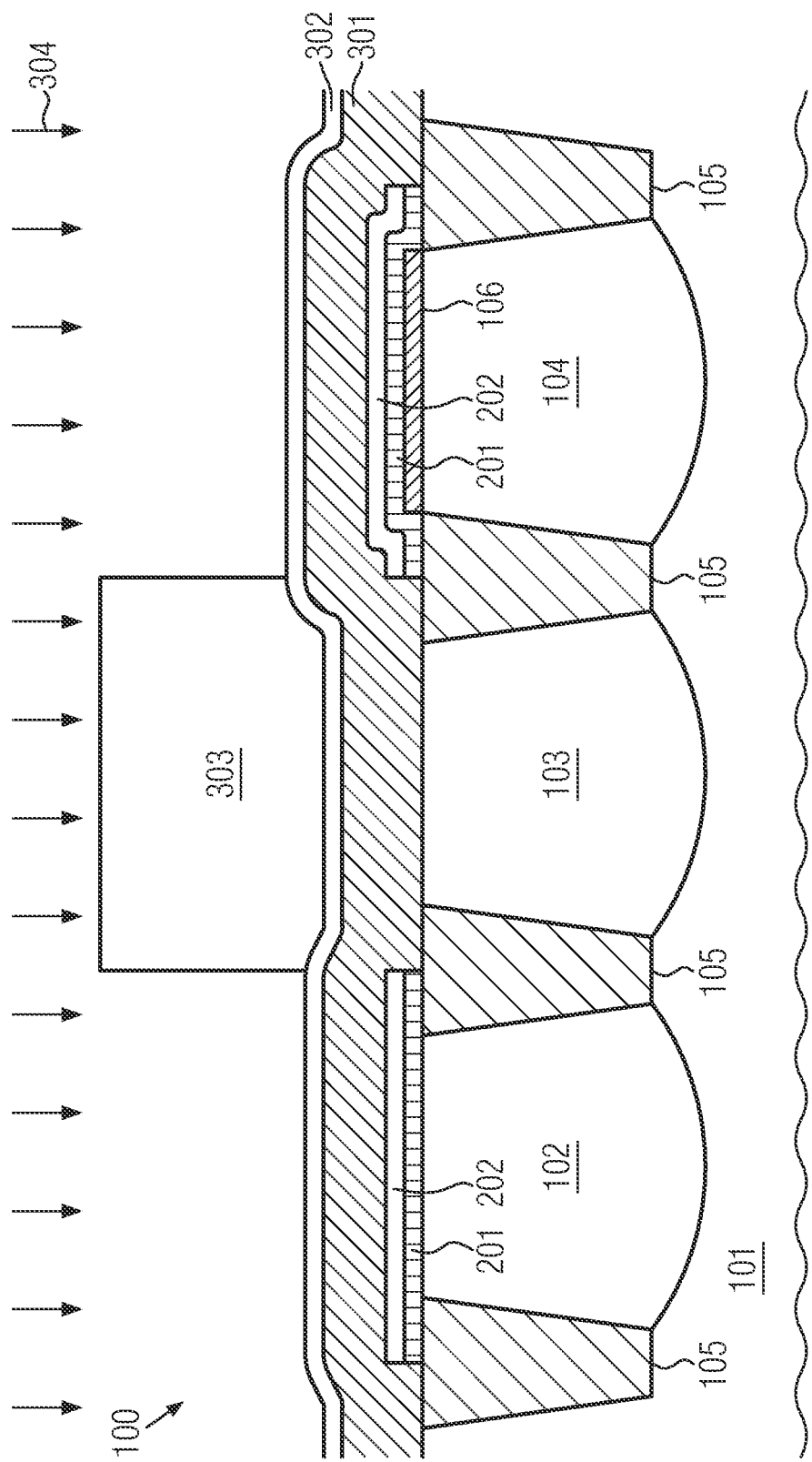

FIG. 3 shows a schematic cross-sectional view of the semiconductor structure 100 in a later stage of the manufacturing process. After the one or more etch processes 204, the mask 203 may be removed by means of a resist strip process and a ferroelectric transistor dielectric 301 may be deposited over the semiconductor structure 100. A portion of the ferroelectric transistor dielectric 301 over the ferroelectric transistor region 103 may be provided directly on the semiconductor material of the substrate 101 that is exposed at the surface of the ferroelectric transistor region 103 after the one or more etch processes 204. Portions of the ferroelectric transistor dielectric 301 over the logic transistor region 102 and the input/output transistor region 104 are separated from the semiconductor material of the substrate 101 in the logic transistor region 102 and the input/output transistor region 104 by the logic transistor dielectric 201 and the first metal 202 and, in the case of the input/output transistor region 104, the input/output transistor dielectric 106.

In some embodiments, the ferroelectric transistor dielectric 301 may include an oxide including hafnium. In some embodiments, the ferroelectric transistor dielectric 301 may include hafnium dioxide. The ferroelectric transistor dielectric 301 may be doped. For example, in some embodiments, the ferroelectric transistor dielectric 301 may include silicon-doped hafnium dioxide. Aluminum-doped hafnium dioxide, yttrium-doped hafnium dioxide, gadolinium-doped hafnium dioxide and/or hafnium zirconium dioxide may also be employed. In further embodiments, the ferroelectric transistor dielectric 301 may include substantially undoped hafnium dioxide.

Directly after the deposition of the ferroelectric transistor dielectric 301, the ferroelectric transistor dielectric 301 need not have ferroelectric properties. In some embodiments, the deposition process used for depositing the ferroelectric transistor dielectric 301 may be adapted such that the deposited material is substantially amorphous, and a crystalline structure of the ferroelectric transistor dielectric 301 having ferroelectric properties may be obtained by means of an annealing process that is performed in a later stage of the manufacturing process, as will be described in more detail below.

In embodiments wherein the ferroelectric transistor dielectric 301 includes silicon-doped hafnium dioxide, an ALD process may be performed for depositing the ferroelectric transistor dielectric 301. In the ALD process, tetrakis(ethylmethylamino)-hafnium, tetrakis-dimethylamino-silane and ozone may be employed. In some embodiments, metal organic precursors may additionally be used. The atomic layer deposition may be performed at a temperature of less than 500° C., for example at a temperature in a range from about 300-400° C., in particular at a temperature of about 350° C. A silicon content of the ferroelectric transistor dielectric 301 may be in a range from about 2-5 mol %, in particular in a range from about 2.5-4.5 mol %. The silicon dioxide content of the ferroelectric transistor dielectric 301 may be controlled by varying the composition of the gases employed in the ALD process. Depositing the ferroelectric transistor dielectric 301 at a relatively low temperature as described above may help to obtain an amorphous structure of the as-deposited ferroelectric transistor dielectric 301.

In embodiments wherein the ferroelectric transistor dielectric 301 includes aluminum-doped hafnium dioxide, yttrium-doped hafnium dioxide or gadolinium-doped hafnium dioxide, an ALD process wherein tetrakis(ethylmethylamino) hafnium, hafnium tetrachloride as well as ozone and/or water are used may be employed. Furthermore, depending on whether the ferroelectric transistor dielectric 301 includes aluminum, yttrium or gadolinium, trimethylaluminum, tris (methylcyclopentadienyl)yttrium or tris(isopropylcyclopentadienyl)-gadolinium may be used. Further parameters of the ALD process may correspond to those described above in the context of embodiments wherein the ferroelectric transistor dielectric 301 includes silicon-doped hafnium dioxide.

In embodiments wherein the ferroelectric transistor dielectric 301 includes hafnium zirconium dioxide, an ALD process wherein tetrakis(ethylmethylamino)zirconium, tetrakis(ethylmethylamino)hafnium and ozone are used may be performed for depositing the ferroelectric transistor dielectric 301. In some embodiments, the hafnium zirconium dioxide may have a composition in accordance with the formula $Hf_{0.5}Zr_{0.5}O_2$. Further parameters of the ALD process may correspond to those described above in the context of embodiments wherein the ferroelectric transistor dielectric 301 includes silicon-doped hafnium dioxide.

In embodiments wherein the ferroelectric transistor dielectric 301 includes substantially undoped hafnium dioxide, a CVD or an ALD process may be used for forming the ferroelectric transistor dielectric 301, wherein materials and/or parameters corresponding to the embodiments described above are used but the substances provided for doping the ferroelectric transistor dielectric 301 are omitted.

The present disclosure is not limited to embodiments wherein an ALD process is used for depositing the ferroelectric transistor dielectric 301. In other embodiments, a physical vapor deposition (PCVD) process, for example a sputtering process, may be employed.

A thickness of the ferroelectric transistor dielectric 301 may be in a range of about 20 nm or less.

After the formation of the ferroelectric transistor dielectric 301, a second metal 302, which may be provided in the form of a metal compound such as, for example, titanium nitride, may be deposited over the semiconductor structure 100, for example, by means of a CVD process or a PECVD process. In some embodiments, the second metal 302 may include a different material than the first metal 202, as it may require a different optimization compared to the first metal 202 that is used for forming metal gates of the logic transistor that will be formed at the logic transistor region 102 and the input/output transistor that will be formed at the input/output transistor region 104.

Thereafter, an annealing process may be performed, wherein the ferroelectric transistor dielectric 301 is annealed in the presence of the second metal 302 for obtaining a crystalline structure of the ferroelectric transistor dielectric 301 having ferroelectric properties. The annealing process may be a rapid thermal annealing process wherein the semiconductor structure 100 is exposed to a temperature that is greater than a crystallization temperature of the material of the ferroelectric transistor dielectric 301. In some embodiments, in the annealing process, the semiconductor structure 100 may be exposed to a temperature of more than about 450° C., in particular a temperature in a range from about 450-1000° C., a temperature in a range from about 500-800° C. and/or a temperature of about 650° C.

The present disclosure is not limited to embodiments wherein the ferroelectric transistor dielectric 301 includes an oxide including hafnium as described above. In other embodiments, other known ferroelectric materials may be provided as the ferroelectric transistor dielectric 301.

A mask 303 may be formed over the semiconductor structure 100. The mask 303 may include a photoresist and may be formed by means of techniques of photolithography. The mask 303 covers the ferroelectric transistor region 103 but not the logic transistor region 102 and the input/output transistor region 104, so that portions of the second metal 302 over the logic transistor region 102 and the input/output transistor region 104 are exposed at the surface of the semiconductor structure 100.

Thereafter, one or more etch processes may be performed, as schematically denoted by arrows 304 in FIG. 3. The one or more etch processes 304 may be adapted for removing the second metal 302 and for selectively removing the ferroelectric transistor dielectric 301 relative to the first metal 202. Thus, in the one or more etch processes 304, portions of the ferroelectric transistor dielectric 301 and the second metal 302 over the logic transistor region 102 and the input/output transistor region 104 may be removed. The portions of the first metal 202 over the logic transistor region 102 and the input/output transistor region 104 may be used as an etch stop layer in the one or more etch processes 304. The one or more etch process 304 may include a combination or one or more known dry and/or wet etch steps for removing the materials of the second metal 302 and the ferroelectric transistor dielectric 301.

Figure 4:
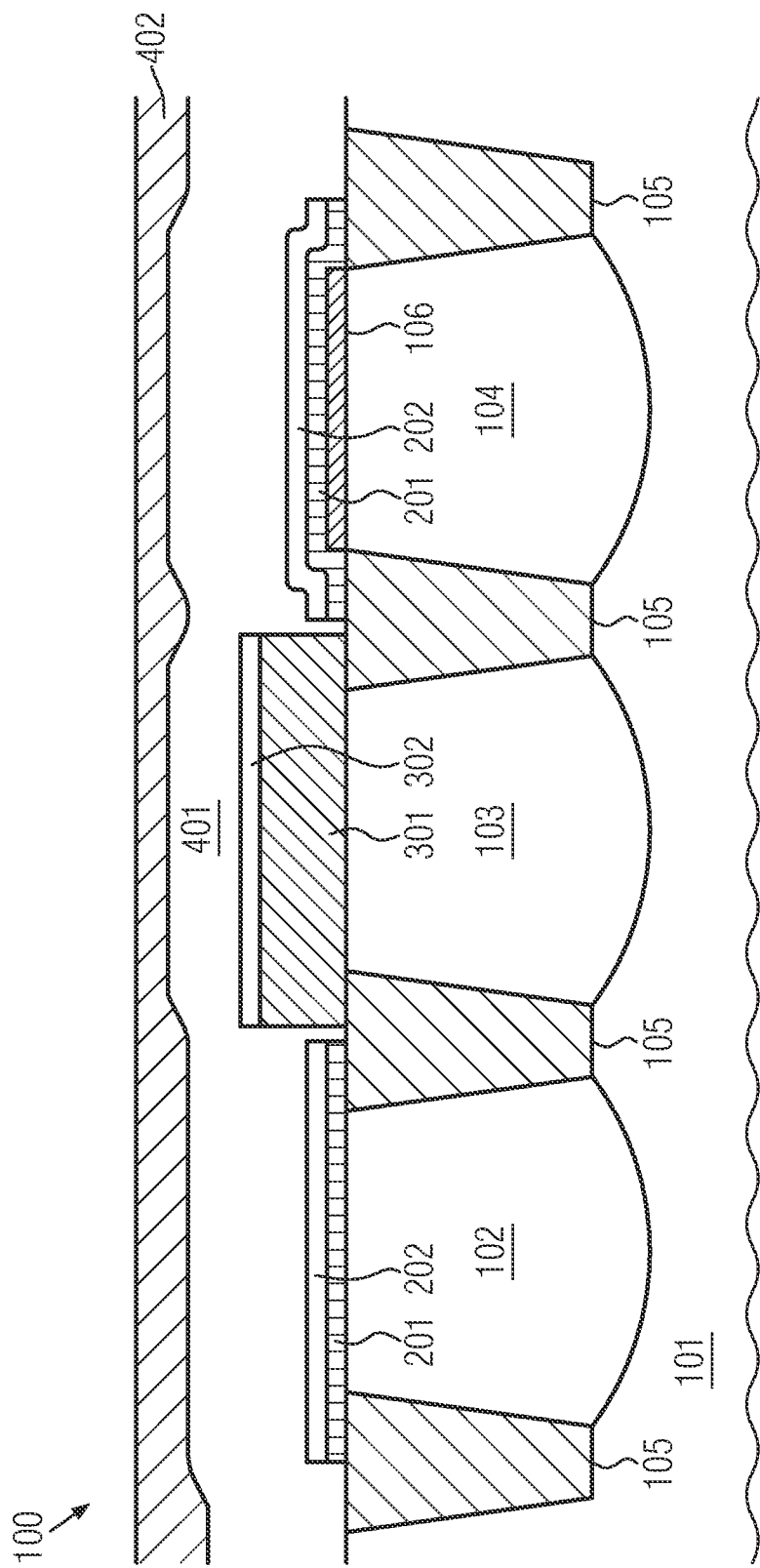

FIG. 4 shows a schematic cross-sectional view of the semiconductor structure 100 in a later stage of the manufacturing process. After the one or more etch processes 304, the mask 303 may be removed and a gate electrode material 401 may be deposited over the semiconductor structure 100. The gate electrode material 401 may be provided directly on the first metal 202 exposed at the surface of the semiconductor structure 100 in the logic transistor region 102 and the input/output transistor region 104 after the one or more etch processes 304 and directly on the second metal 302 exposed at surface of the semiconductor structure 100 in the ferroelectric transistor region 103. The gate electrode material 401 may include a semiconductor material, for example polysilicon and/or amorphous silicon. After the deposition of the gate electrode material 401, a hard mask material 402, for example silicon nitride, may be deposited over the semiconductor structure 100. For depositing the gate electrode material 401 and the hard mask material 402, deposition techniques, such as CVD and/or PECVD, may be employed.

Figure 5:
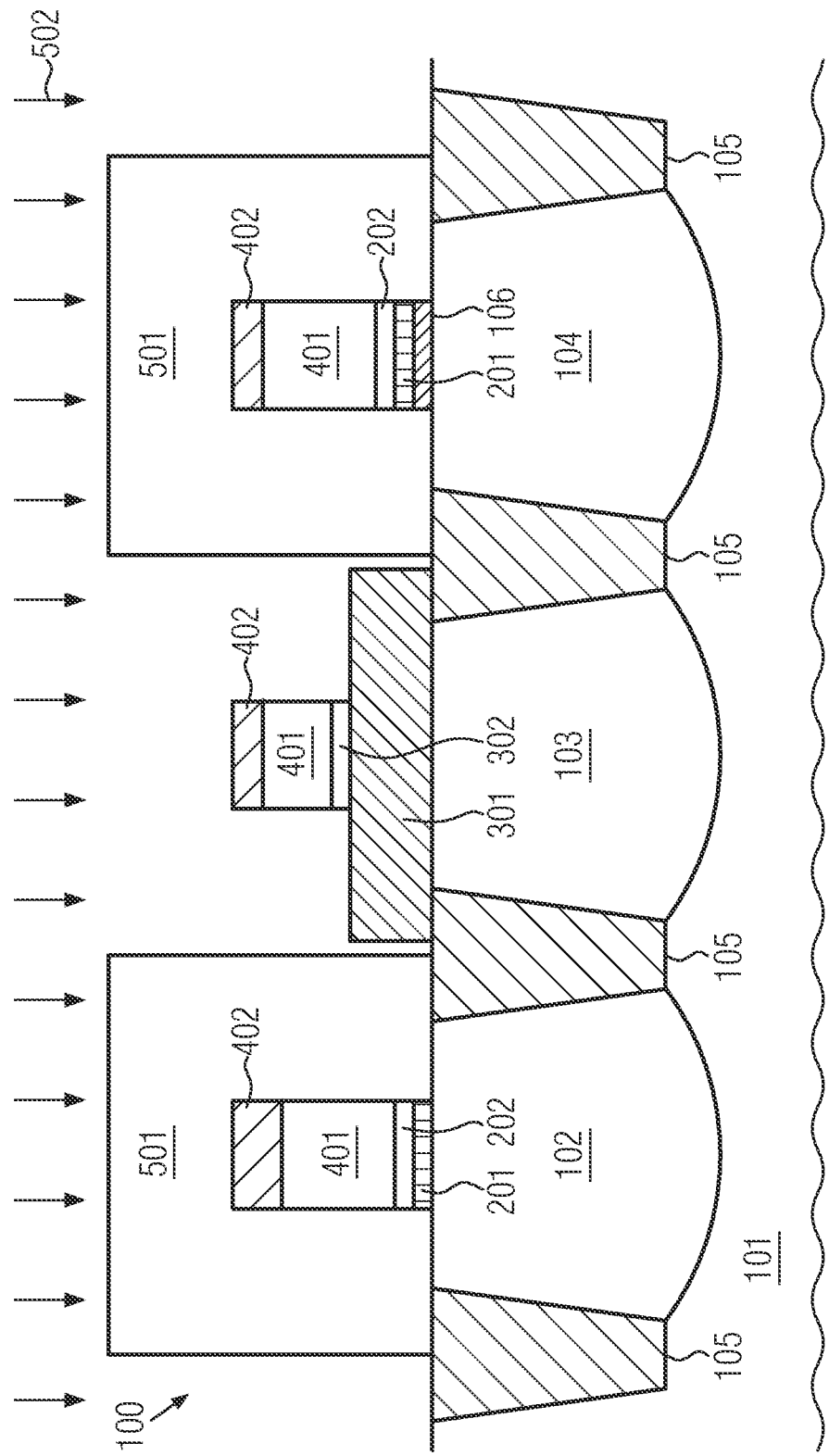

FIG. 5 shows a schematic cross-sectional view of the semiconductor structure 100 in a later stage of the manufacturing process. After the deposition of the hard mask material 402, the hard mask material 402 may be patterned for forming a hard mask. The hard mask may cover portions of the gate electrode material 401 over the logic transistor region 102, the ferroelectric transistor region 103 and the input/output transistor region 104 from which gate electrodes of the logic transistor to be formed at the logic transistor region 102, the ferroelectric transistor to be formed at the ferroelectric transistor region 103 and the input/output transistor to be formed at the input/output transistor region 104 will be formed, as detailed below. Further portions of the hard mask may cover portions of the gate electrode material 401 from which polysilicon lines of the semiconductor structure 100 are to be formed (not shown).

For forming the hard mask from the hard mask material 402, techniques of photolithography and etching may be employed, wherein separate processes of photolithography and etching may be employed for forming portions of the hard mask used for the formation of polysilicon lines and portions of the hard mask used for forming gate electrodes over the logic transistor region 102, the ferroelectric transistor region 103 and the input/output transistor region 104. The formation of portions of the hard mask used for the formation of polysilicon lines may be performed before the formation of portions of the hard mask that are used for the formation of gate electrodes.

Thereafter, one or more etch processes may be performed for removing portions of the gate electrode material 401 over the logic transistor region 102, the ferroelectric transistor 103 and the input/output transistor region 104 which are not covered by the hard mask 402. Additionally, the one or more etch processes may remove portions of the first metal 202, the second metal 302, the logic transistor dielectric 201 and the input/output transistor dielectric 106 which are not covered by the hard mask. However, in some embodiments, the one or more etch processes may stop at the ferroelectric transistor dielectric 301, so that portions of the ferroelectric transistor dielectric 301 which are not below the hard mask 402 may remain on the semiconductor structure 100, as illustrated in FIG. 5.

For removing such portions of the ferroelectric transistor dielectric 301, a mask 501 may be formed over the semiconductor structure 100. The mask 501 may include a photoresist, and may be formed by means of a photolithography process. The mask 501 may cover the logic transistor region 102 and the input/output transistor region 104 but not the ferroelectric transistor region 103. Thereafter, an etch process adapted for selectively removing the ferroelectric transistor dielectric 301 relative to the hard mask material 402 may be performed, as schematically illustrated by arrows 502 in FIG. 5. The etch process 502 may remove portions of the ferroelectric transistor dielectric 301 adjacent the gate electrode provided by the portion of the gate electrode material 401 covered by the hard mask 402.

In some embodiments, a protection liner (not shown), which may, for example, include a conformal layer of silicon nitride, may be deposited over the semiconductor structure 100 before the formation of the mask 501 and the etch process 502 for protecting the portion of the second metal 302 over the ferroelectric transistor region 103 from being affected by the etchant used in the etch process 502.

After the etch process 502, the mask 501 may be removed by means of a resist strip process, and further processes including ion implantation processes for forming source regions and drain regions in each of the logic transistor region 102, 103, 104 may be performed for completing the formation of a logic transistor in the logic transistor region 102, a ferroelectric transistor in the ferroelectric transistor region 103, and an input/output transistor in the input/output transistor region 104. These processes may be performed in accordance with conventional processes employed in the formation of field effect transistors in integrated circuits. In some embodiments, a mask (not shown) covering the logic transistor region 102 and the input/output transistor region 104, but not the ferroelectric transistor region 103, may be formed, and one or more ion implantation processes for forming halo and/or extension regions in the ferroelectric transistor region 103 may be performed for adjusting properties of the ferroelectric transistor.

Embodiments as described above may allow the integration of three different gate oxides, which may be used in typical embedded memory applications for logic transistors, input/output transistors and memory devices including ferroelectric transistors on the same chip. The ferroelectric transistor dielectric 301 may be protected from thermal cycles and oxidations as well as the work function engineering for the logic transistors. A separate metal gate may be employed for the ferroelectric transistor, and it may be tailored as necessary. In some embodiments, the gate insulation layers of the logic transistors and the input/output transistors as well as the work function engineering of the logic transistors and the input/output transistors may be performed in substantially the same manner as in conventional complementary metal oxide semiconductor (CMOS) integrated circuits.

Advantageously, this may help to substantially avoid an alteration of the topography and narrow width behavior of logic transistors and input/output transistors.

Figure 6:
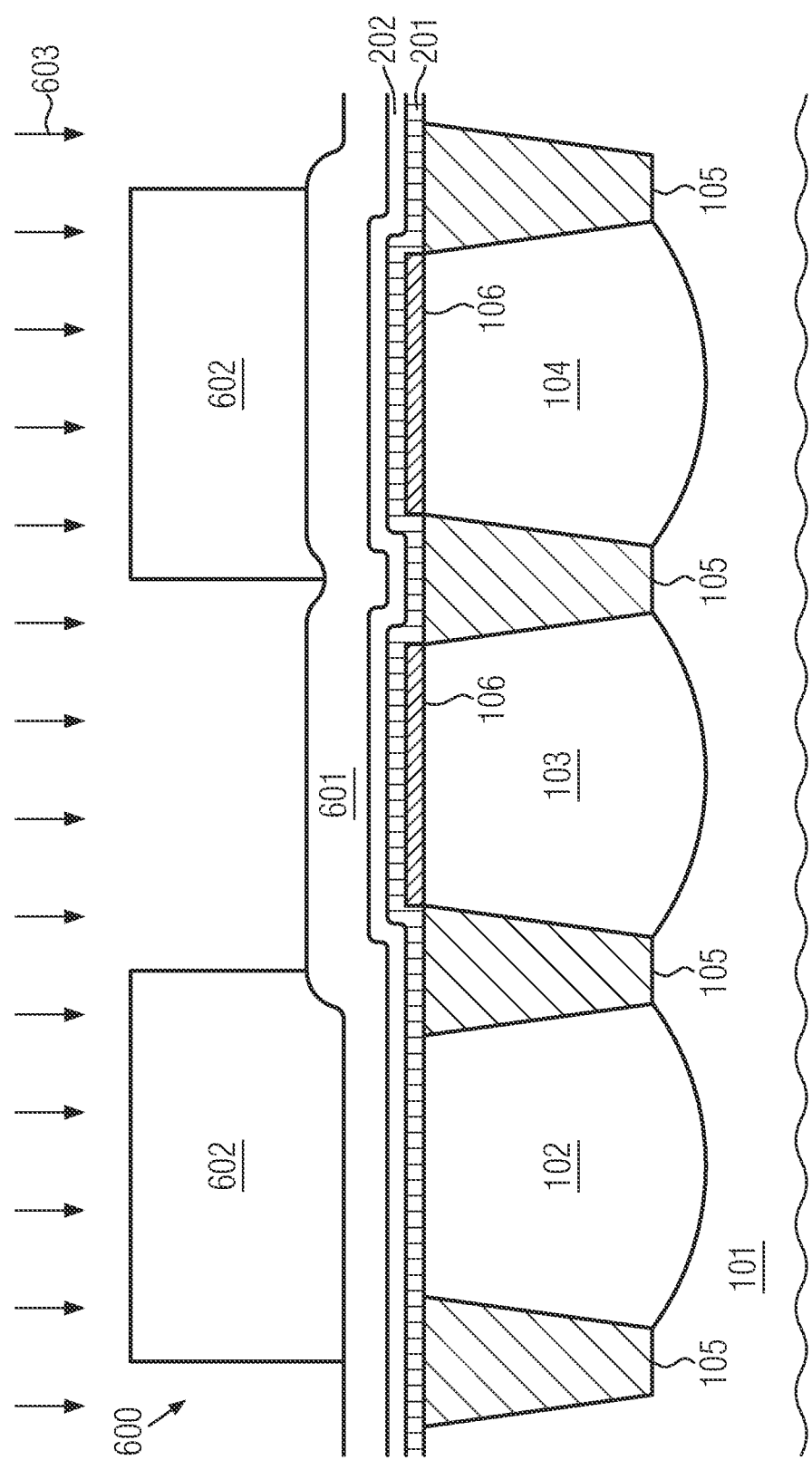
FIGS. 6-7 show schematic cross-sectional views of a semiconductor structure according to an embodiment in stages of a manufacturing process according to an embodiment.

Further embodiments will be described with reference to FIGS. 6 and 7. FIG. 6 shows a schematic cross-sectional view of a semiconductor structure 600 according to an embodiment in a stage of a manufacturing process according to an embodiment. For convenience, in FIGS. 6 and 7, on the one hand, and in FIGS. 1-5 on the other hand, like reference numerals have been used to denote like components. Unless explicitly described otherwise, components having like reference numerals may have substantially the same or at least similar features and substantially the same or similar processes may be used for the formation thereof. Accordingly, a detailed description thereof will sometimes be omitted.

The semiconductor structure 600 includes a substrate 101. The substrate 101 includes a logic transistor region 102, a ferroelectric transistor region 103 and an input/output transistor region 104. A shallow trench isolation structure 105 provides electrical insulation between the logic transistor region 102, the ferroelectric transistor region 103 and the input/output transistor region 104, as well as between the logic transistor region 102, the ferroelectric transistor region 103, the input/output transistor region 104 and other circuit elements in the semiconductor structure 600. An input/output transistor dielectric 106 is provided over the ferroelectric transistor region 103 and the input/output transistor region 104 but not over the logic transistor region 102. Additionally, a logic transistor dielectric 201 and a first metal 202 are provided over each of the logic transistor region 102, the ferroelectric transistor region 103 and the input/output transistor region 104. These features may be formed as described as above with reference to FIGS. 1 and 2.

The semiconductor structure 600 further includes a protection layer 601. The protection layer 601 may be formed of a material that may be etched selectively relative to the first metal 202 and is able to withstand operation conditions that may occur in the deposition of a ferroelectric transistor dielectric having features corresponding to those of the ferroelectric transistor dielectric 301 described above with reference to FIG. 3. In some embodiments, the protection layer 601 may be a layer of silicon nitride, and it may be formed by means of a deposition process, such as CVD or PECVD.

After the formation of the protection layer 601, a mask 602 may be formed over the semiconductor structure 600. The mask 602 may be a photoresist mask, and may be formed by means of photolithography. The mask 602 covers the logic transistor region 102 and the input/output transistor region 104, but not the ferroelectric transistor region 103. Thus, a portion of the protection layer 601 above the ferroelectric transistor region 103 is exposed at the surface of the semiconductor structure 600.

Thereafter, one or more etch processes adapted to remove the materials of the protection layer 601, the first metal 202, the logic transistor dielectric 201 and the input/output transistor dielectric 106 may be performed, as schematically denoted by arrows 603 in FIG. 6. The one or more etch processes 603 may include known wet or dry etch processes, as well as combinations of known wet etch processes and known dry etch processes. After the one or more etch processes 603, the semiconductor material of the substrate 101 is exposed at the ferroelectric transistor region 103. Portions of the protection layer 601, the first metal 202, the logic transistor dielectric 201 and the input/output transistor dielectric 106 over the logic transistor region 102 and the input/output transistor region 104 are protected from being affected by the one or more etch processes 603 by the mask 602 and remain in the semiconductor structure 600.

Figure 7:
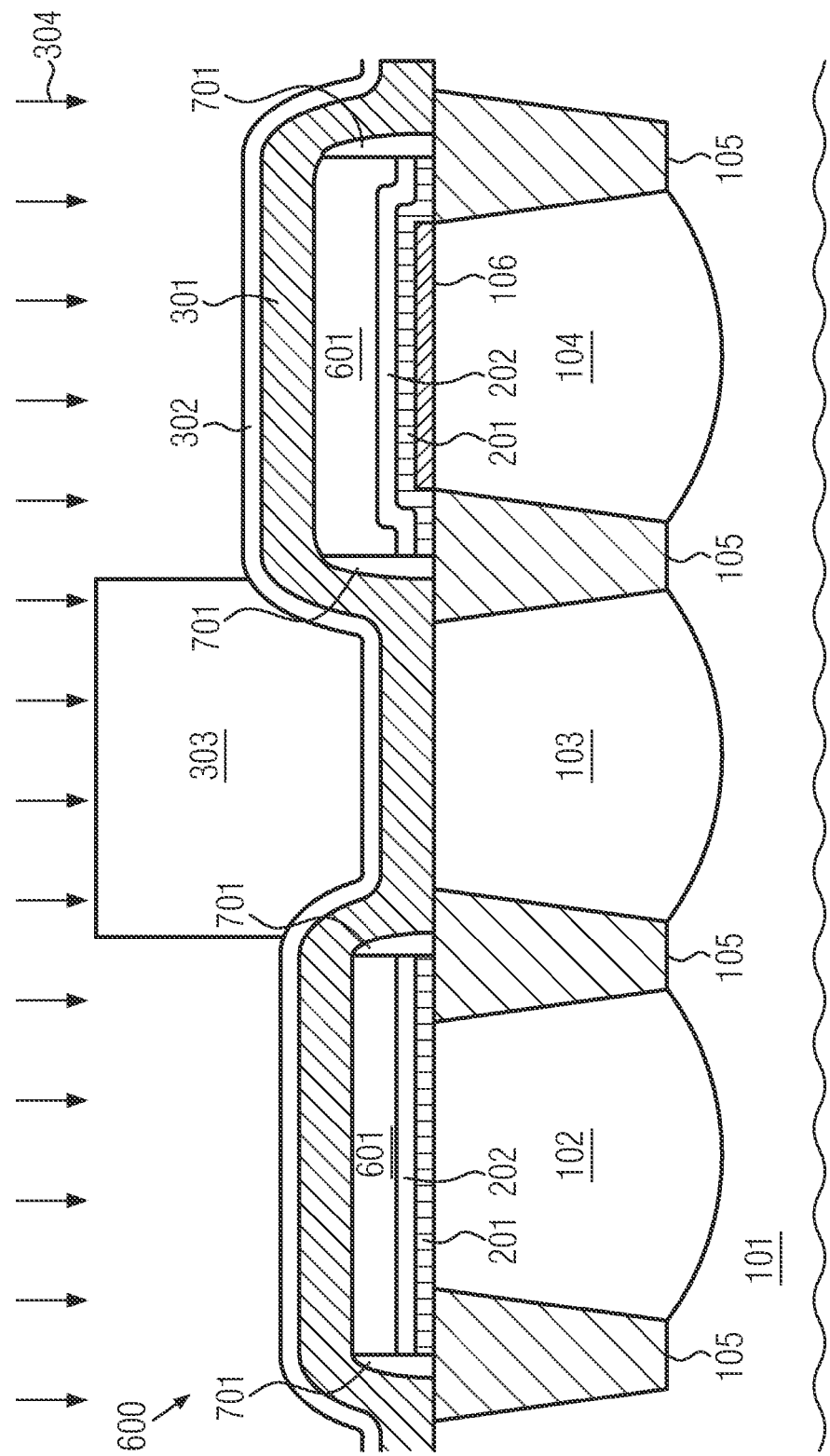

FIG. 7 shows a schematic cross-sectional view of the semiconductor structure 600 in a later stage of the manufacturing process. After the one or more etch processes 603, the mask 602 may be removed by means of a resist strip process, and a spacer 701 may be formed at sidewalls of the stack of the logic transistor dielectric 201, the first metal 202 and the protection layer 601 over the logic transistor region 102, as well as the sidewalls of the stack of the input/output transistor dielectric 106, the logic transistor dielectric 201, the first metal 202 and the protection layer 601 over the input/output transistor region 104. This may be done by substantially isotropically depositing a layer of a material of the spacer 701, for example a layer of silicon nitride, over the semiconductor structure 600 and performing an anisotropic etch process for removing portions of the layer of the material of the spacer 701 from substantially horizontal portions of the semiconductor structure 600, such as, for example, the surface of the substrate exposed at the ferroelectric transistor region 103 and top surfaces of the protection layer 601. Due to the anisotropy of the etch process, portions of the layer of the material of the spacer 701 at the sidewalls of the layer stacks on the logic transistor region 102 and the input/output transistor region 104 may remain in the semiconductor structure 600 and may form the spacer 701. The spacer 701 may provide protection for the portions of the layers of the input/output transistor dielectric 106, the logic transistor dielectric 201 and the first metal 202 over the logic transistor region 102 and the input/output transistor region 104, in addition to the protection provided by the protection layer 601. The present disclosure, however, is not limited to embodiments wherein the spacer 701 is formed. In other embodiments, the formation of the spacer 701 may be omitted.

Thereafter, a ferroelectric transistor dielectric 301 and a second metal 302 may be formed, using techniques as described above with reference to FIG. 3. Moreover, an annealing process may be performed for obtaining a crystal structure of the material of the ferroelectric transistor dielectric 301 that has ferroelectric properties.

Then, a mask 303 may be formed over the semiconductor structure 600. The mask 303 may be a photoresist mask, and it may be formed by means of techniques of photolithography. The mask 303 covers the ferroelectric transistor region 103 but not the logic transistor region 102 and the input/output transistor region 104.

Then, one or more etch processes may be performed for removing the second metal 302 and the ferroelectric transistor dielectric 301 from the logic transistor region 102 and the input/output transistor region 104. In FIG. 7, the one or more etch processes are schematically denoted by arrows 304. The one or more etch processes 304 may include one or more known wet or dry etch processes.

Thereafter, a further etch process may be performed for removing the protection layer 601 and the spacer 701 from the semiconductor structure 600, and the mask 303 may be removed by means of a resist strip process.

In the configuration of the semiconductor structure obtained after the removal of the protection layer 601 and the spacer 701, the logic transistor dielectric 201 and the first metal 202 are provided over the logic transistor region 102, the ferroelectric transistor dielectric 301 and the second metal 302 are provided over the ferroelectric transistor region 103, and the input/output transistor dielectric 106, the logic transistor dielectric 201 and the first metal 202 are provided over the input/output transistor region 104.

Thereafter, further processing steps as described above with reference to FIGS. 4 and 5 may be performed for providing a logic transistor at the logic transistor region 102, a ferroelectric transistor at the ferroelectric transistor region 103 and an input/output transistor at the input/output transistor region 104.

Compared to the embodiments described above with reference to FIGS. 1-5, due to the use of the protection layer 601 in the embodiments described with reference to FIGS. 6 and 7, the first metal 202 need not be used as an etch stop layer in the patterning of the ferroelectric transistor dielectric 301. Thus, a risk of damage of the first metal 202 by the etch process used for patterning the ferroelectric transistor dielectric 301 may be advantageously avoided.

Figure 8:
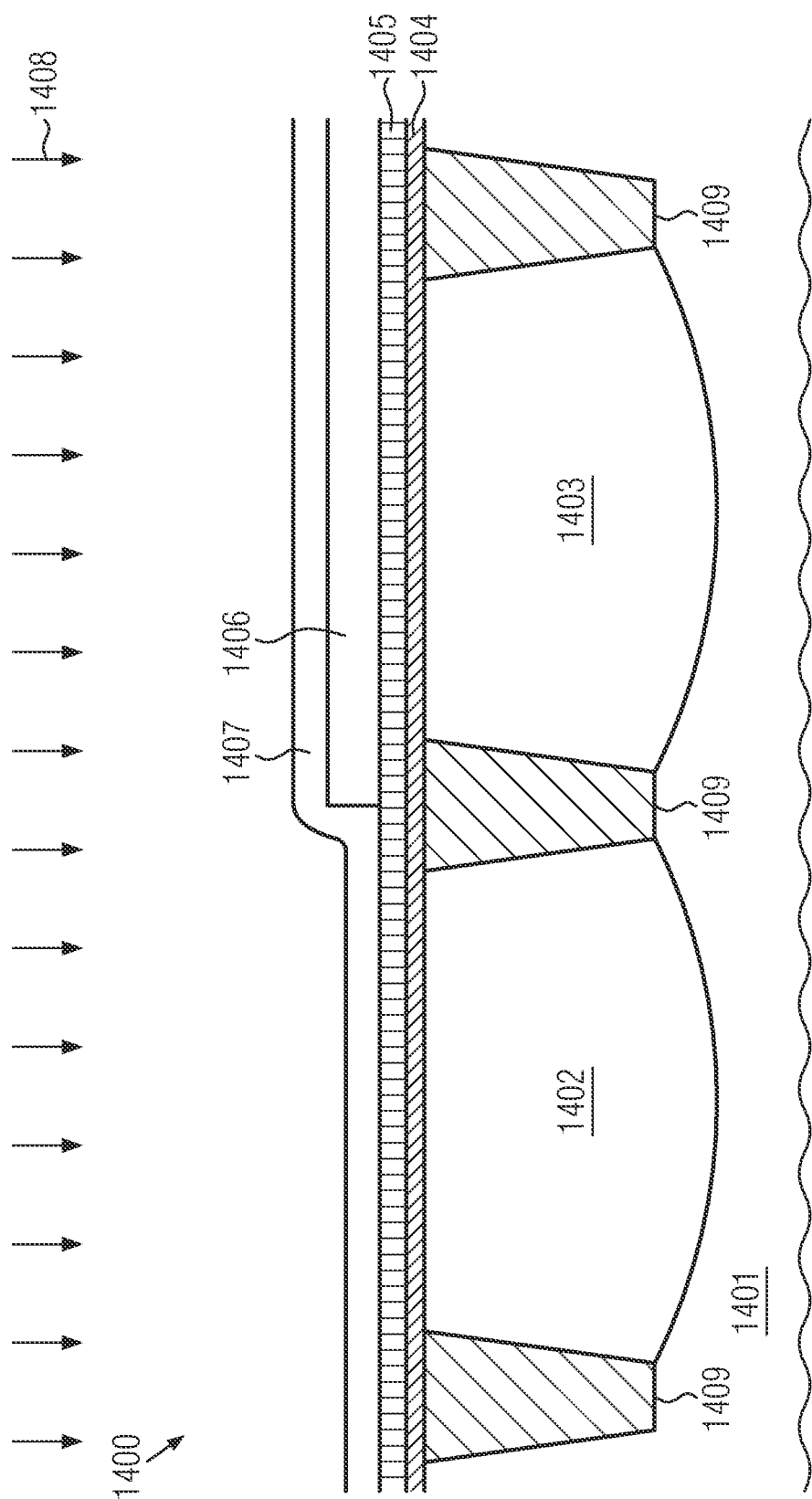
FIGS. 8-10 show schematic cross-sectional views of a semiconductor structure according to an embodiment in stages of a manufacturing process according to an embodiment.

FIG. 8 shows a schematic cross-sectional view of a semiconductor structure 1400 according to an embodiment in a stage of a manufacturing process according to an embodiment. The semiconductor structure 1400 includes a substrate 1401. Similar to the substrate 101 in the embodiments described above, the substrate 1401 may be a bulk semiconductor substrate or an SOI substrate.

The substrate 1401 includes a first transistor region 1402 and a second transistor region 1403. A shallow trench isolation structure 1409 provides electrical insulation between the first transistor region 1402 and the second transistor region 1403, as well as electrical insulation between the transistor regions 1402, 1403 and other circuit elements (not shown) in the semiconductor structure 1400. Each of the transistor regions 1402, 1403 may have a doping which is different from a base doping of the substrate 1401, and which may correspond to the type of transistor to be formed in the respective one of the transistor regions 1402, 1403.

The first transistor region 1402 may represent a ferroelectric transistor region similar to the ferroelectric transistor region 103 in the embodiments described above with reference to FIGS. 1-7, wherein a ferroelectric transistor having a gate insulation layer including a ferroelectric material will be formed. The second transistor region 1403 may represent a transistor region wherein a transistor of another type, for example a logic transistor or an input/output transistor, will be formed. Accordingly, the second transistor region 1403 may represent a logic transistor region similar to the logic transistor region 102 in the embodiments described above with reference to FIGS. 1-7 or an input/output transistor region similar to the input/output transistor region 104 in the embodiments described above with reference to FIGS. 1-7.

In the following, embodiments will be described wherein the second transistor region 1403 represents a logic transistor region. In other embodiments wherein the second transistor region 1403 represents an input/output transistor region, an input/output transistor dielectric similar to the input/output transistor dielectric 106 may be formed above the second transistor region 1403 but not over the first transistor region 1402 before the processing steps described in the following are performed. For this purpose, a layer of an electrically insulating material, for example a layer of silicon dioxide, may be formed over the semiconductor structure 1400 by means of a thermal oxidation process and/or a deposition process. Thereafter, a portion of the layer of electrically insulating material over the first transistor region 1402 may be removed using techniques of photolithography and etching. Thereafter, the processing of the semiconductor structure 1400 may continue as described in the following.

A silicon dioxide layer 1404 may be deposited over the semiconductor structure 1400. This may be done using techniques of thermal oxidation and/or deposition techniques, such as CVD or PECVD. Thereafter, a layer 1405 of a high-k dielectric material may be deposited over the semiconductor structure 1400. The layer 1405 of high-k dielectric material may include a material having a greater dielectric constant than silicon dioxide, such as, for example, hafnium dioxide. Other high-k materials as described above in the description of the logic transistor dielectric 201 may also be used. The layer 1405 of high-k dielectric material may be formed using conventional deposition techniques for the deposition of high-k dielectric material, such as CVD, PECVD and/or ALD.

Thereafter, a layer 1406 of a first metal may be deposited over the semiconductor structure 1400. The first metal in the layer 1406 may include a metal or a metal compound having a work function suitable for use in a gate electrode of the transistor to be formed at the second transistor region 1403. Accordingly, in embodiments wherein an N-channel transistor is to be formed at the second transistor region 1403, the layer 1406 of first metal may include lanthanum, lanthanum nitride and/or titanium nitride. In embodiments wherein a P-channel transistor is to be formed at the second transistor region 1403, the layer of first metal 1406 may include aluminum and/or aluminum nitride.

After the deposition of the layer 1406 of the first metal, a portion of the layer 1406 of the first metal over the first transistor region 1402 may be removed. This may be done by forming a mask (not shown) over the semiconductor structure 1400 that covers the second transistor region 1403 but not the first transistor region 1402, and performing an etch process adapted to selectively remove the first metal of the layer 1406 relative to the high-k dielectric material of the layer 1405. Then, the mask may be removed by means of a resist strip process.

Thereafter, a layer 1407 of a second metal may be deposited over the semiconductor structure 1400. The second metal of the layer 1407 may be a different metal than the material of the layer 1406 of the first metal, and it may be selected such that it is suitable for a scavenging reaction between the second metal and silicon dioxide from the portion of the silicon dioxide layer 1404 over the first transistor region 1402. In some embodiments, the second metal of the layer 1407 may be substantially pure hafnium, titanium or a titanium nitride alloy. The second metal of the layer 1407 may be selected such that the scavenging reaction has a favorable Gibbs free energy.

Thereafter, an annealing process may be performed, as schematically denoted by arrows 1408 in FIG. 8. The annealing process 1408 may induce a scavenging reaction between the second metal of the layer 1407 or metal dopants in the layer 1407 and silicon dioxide from the portion of the silicon dioxide layer 1404 over the first transistor region 1402. In the scavenging reaction, oxygen from the silicon dioxide layer 1404, which may diffuse through the layer 1405 of high-k dielectric material, may react with the second metal from the layer 1407. In this chemical reaction, an oxidized metal is formed on the second metal, whereas the oxide of the silicon dioxide layer 1404 over the first transistor region 1402 is reduced. This may lead to a reduction of the thickness of the portion of the silicon dioxide layer 1404 over the first transistor region 1402.

A portion of the silicon dioxide layer 1404 over the second transistor region 1403 is separated from the layer 1407 of second metal by the layer 1406 of first metal. The layer 1406 of first metal may have a sufficient thickness to substantially prevent a scavenging effect on the silicon dioxide layer 1404 over the second transistor region, or it can be provided with a diffusion blocking layer (not shown) for this purpose. Thus, the presence of the layer 1406 of first metal over the second transistor region 1403 may substantially prevent or at least reduce a scavenging effect over the second transistor region 1403. Thus, the portion of the silicon dioxide layer 1404 over the first transistor region 1402 may be selectively thinned.

Thinning the portion of the silicon dioxide layer 1404 over the first transistor region 1402 may help to increase the endurance of the ferroelectric transistor that will be formed at the first transistor region 1402. In addition to obtaining a more reliable ferroelectric transistor, thinning the portion of the silicon dioxide layer 1404 over the first transistor region 1402 may help to reduce leakage currents which may occur in the operation of the ferroelectric transistor.

Figure 9:
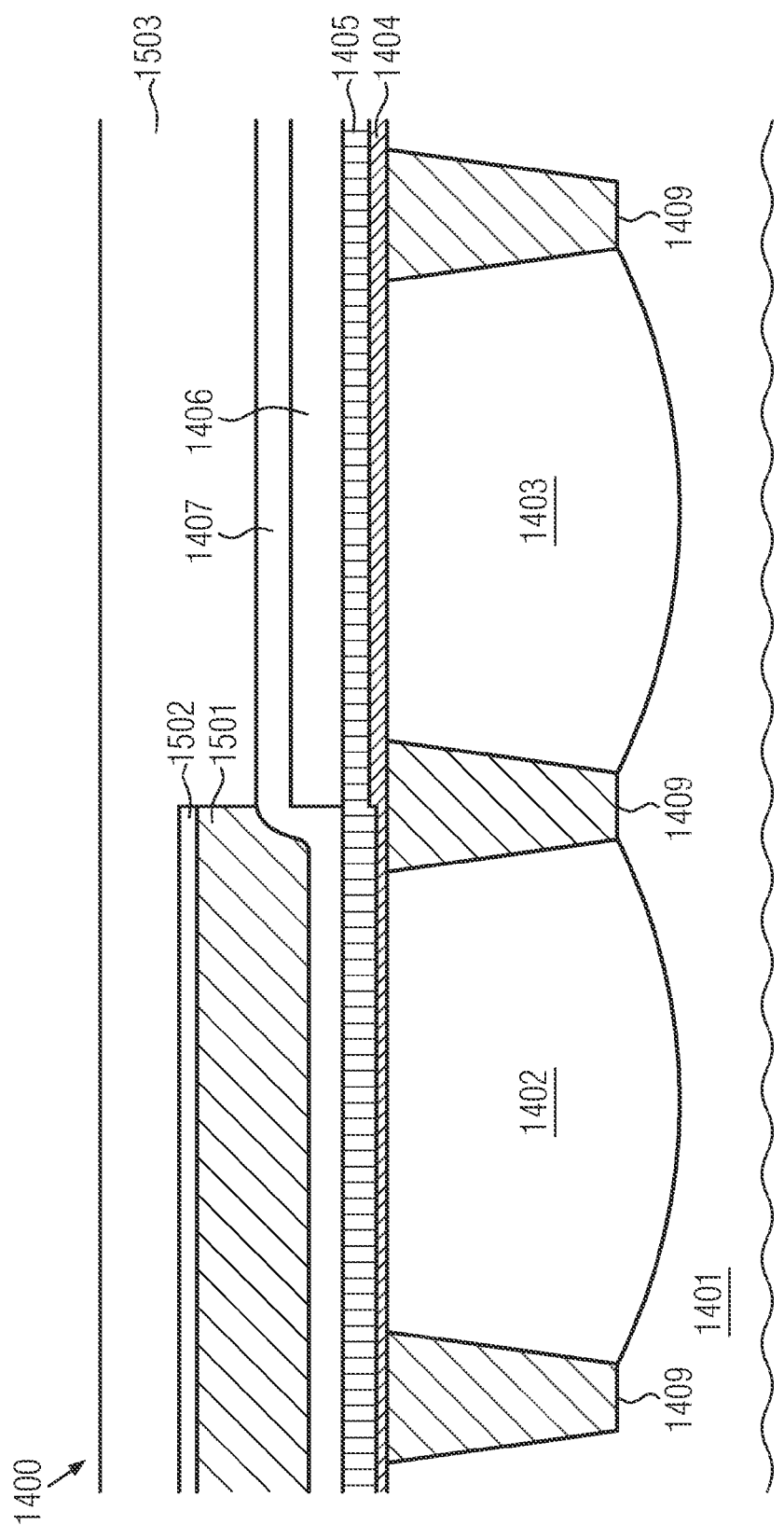

FIG. 9 shows a schematic cross-sectional view of the semiconductor structure 1400 in a later stage of the manufacturing process. After the annealing process 1408, a ferroelectric transistor dielectric 1501 and a layer of third metal 1502 may be formed over the first transistor region 1402. For this purpose, the ferroelectric transistor dielectric 1501 and the third metal 1502 may be deposited over the semiconductor structure 1400, and portions of the ferroelectric transistor dielectric 1501 and the third metal 1502 over the second transistor region 1403 may be removed using techniques of photolithography and etching. In the etch process, the portion of the layer 1407 of second metal over the second transistor region 1403 may be used as an etch stop layer.

The ferroelectric transistor dielectric 1501 may have features corresponding to those of the ferroelectric transistor dielectric 301 in the embodiments described above with reference to FIGS. 1-7, and corresponding techniques may be used for the formation of the ferroelectric transistor dielectric 1501. Moreover, features of the third metal 1502 may correspond to features of the second metal 302 in the embodiments described above with reference to FIGS. 1-6, and corresponding techniques may be employed for the formation thereof.

Similar to the embodiments described above with reference to FIGS. 1-7, after the deposition of the ferroelectric transistor dielectric 1501 and the third metal 1502 over the semiconductor structure 1400, an annealing process may be performed for re-crystallizing the ferroelectric transistor dielectric 1501, so that a crystal structure of the ferroelectric transistor dielectric 1501 having ferroelectric properties is obtained. In some embodiments, this annealing process may be performed before the removal of portions of the ferroelectric transistor dielectric 1501 and the third metal 1502 over the second transistor region 1403. In other embodiments, the annealing process for re-crystallizing the ferroelectric transistor dielectric 1501 may be performed after the removal of the portions of the ferroelectric transistor dielectric 1501 and the third metal 1502 over the second transistor region 1403.

In the annealing process that is performed for re-crystallizing the ferroelectric transistor dielectric 1501, the layer 1407 of second metal may substantially prevent or reduce a diffusion of atoms from other portions of the semiconductor structure 1400, such as, for example, the layer 1405 of high-k dielectric material into the ferroelectric transistor dielectric 1501. Thus, a degradation of the ferroelectric transistor dielectric 1501 may be advantageously avoided. This may contribute to improving the reliability of the ferroelectric transistor formed at the first transistor region 1402 and reducing leakage currents occurring in the ferroelectric transistor.

After the formation of the ferroelectric transistor dielectric 1501 and the layer 1502 of third metal over the first transistor region 1402, a layer 1503 of gate electrode material may be deposited over the semiconductor structure 1400. In some embodiments, the layer 1503 of gate electrode material may include a semiconductor material, for example polysilicon or amorphous silicon. In other embodiments, the layer 1503 of gate electrode material may include a metal, for example aluminum or tungsten.

Figure 10:
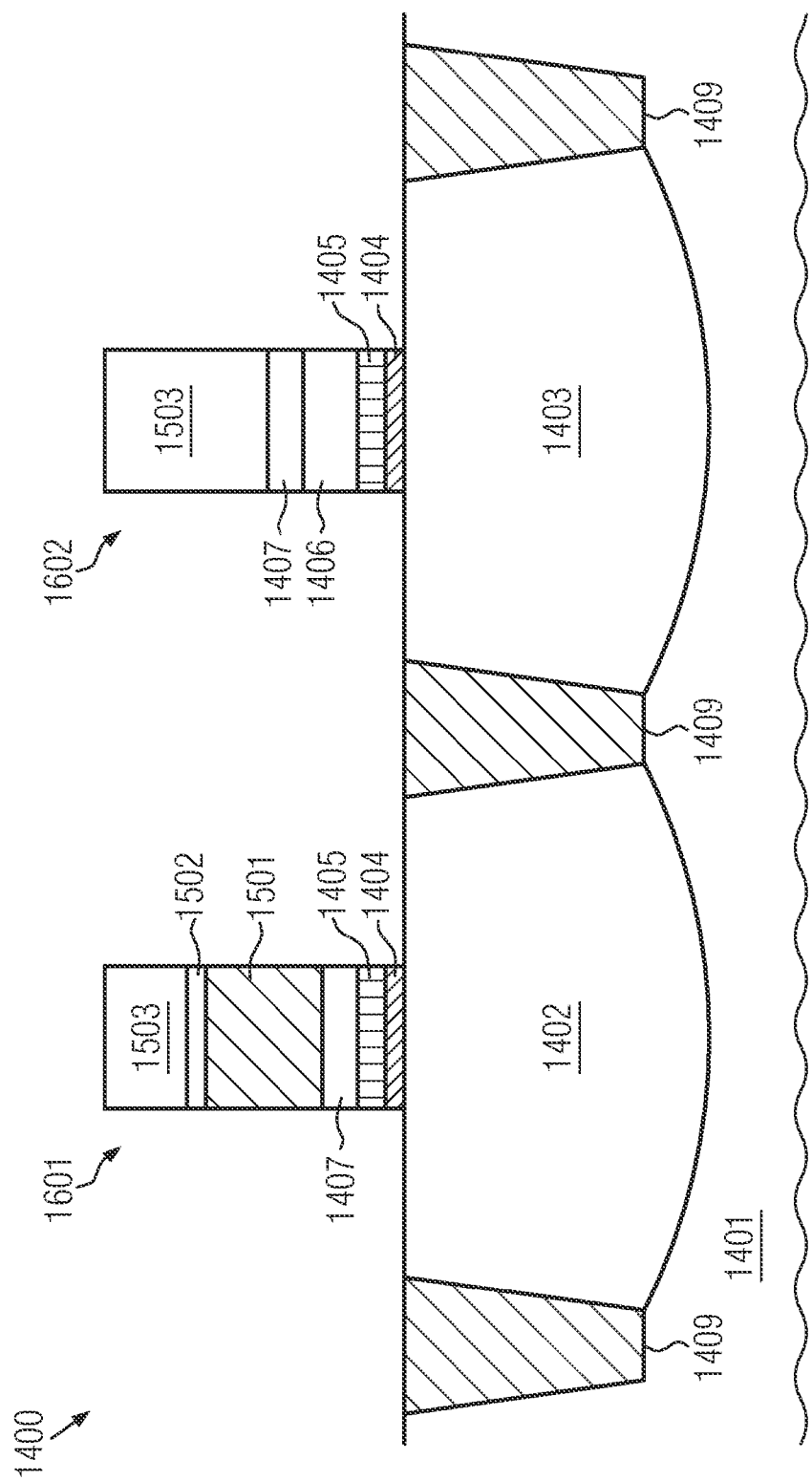

FIG. 10 shows a schematic cross-sectional view of the semiconductor 1400 in a later stage of the manufacturing process. The various layers formed over the first transistor region 1402 and the second transistor region 1403, respectively, may be patterned to form a first gate electrode structure 1601 over the first transistor region 1402 and to form a second gate electrode structure 1602 over the second transistor region 1403. The first gate electrode structure 1601 includes portions of the silicon dioxide layer 1404, the layer 1405 of high-k dielectric material, the layer 1407 of second metal and the ferroelectric transistor dielectric 1501, which provide a gate dielectric of a ferroelectric transistor. Additionally, the first gate electrode structure 1601 includes portions of the layer 1502 of third metal and the layer 1503 of gate electrode material, which provide a gate electrode of the ferroelectric transistor.

The second gate electrode structure 1602 includes portions of the silicon dioxide layer 1404 and the layer 1405 of high-k dielectric material, which provide a gate dielectric of the transistor formed at the second transistor region 1403. Additionally, the second gate electrode structure 1602 includes portions of the layer 1406 of first metal, the layer 1407 of second metal and the layer 1503 of gate electrode material, which provide a gate electrode of the transistor formed at the second transistor region 1403.

Figure 11:
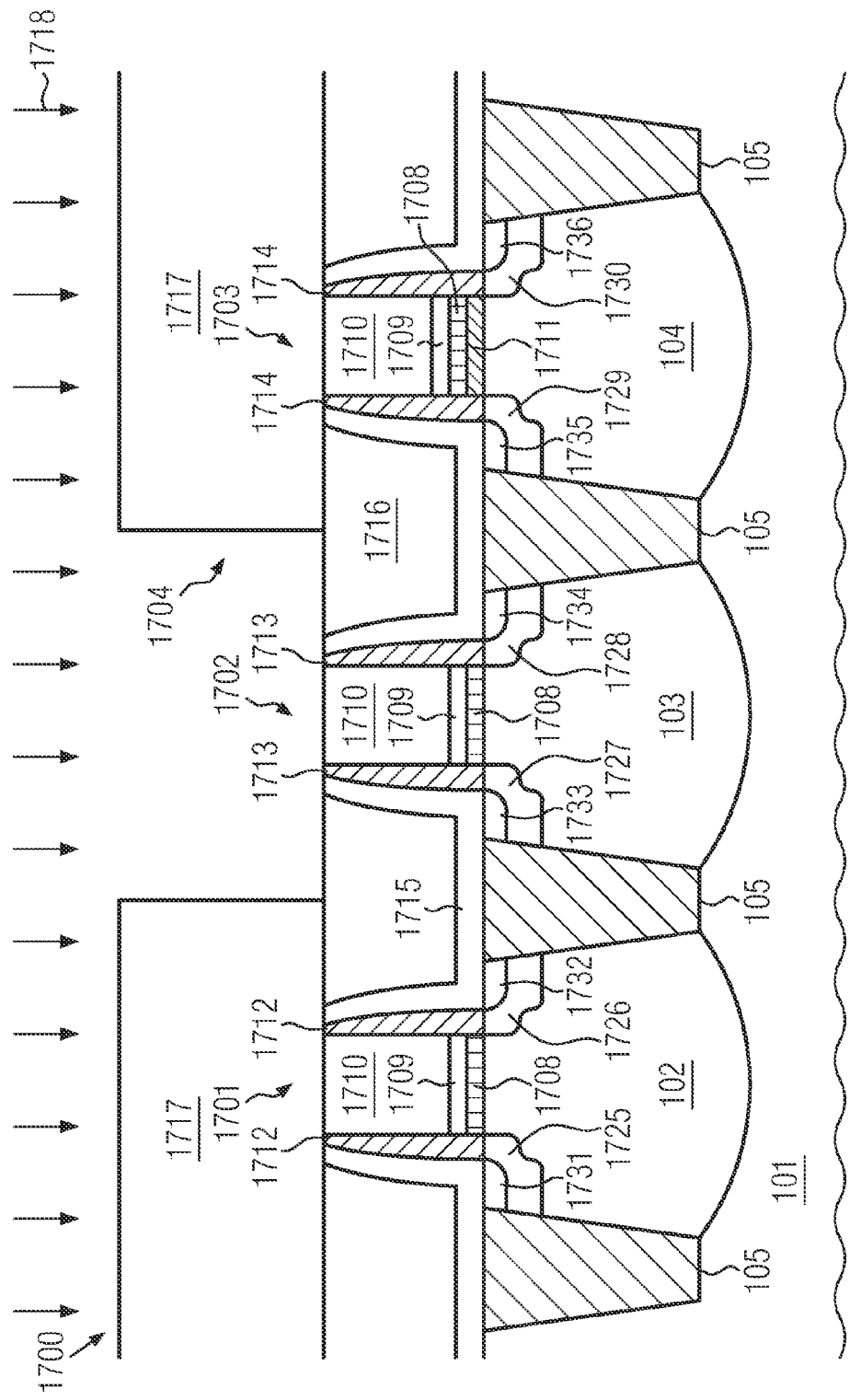
FIGS. 11-13 show schematic cross-sectional views of a semiconductor structure according to an embodiment in stages of a manufacturing process according to an embodiment.

In the following, further embodiments will be described with reference to FIGS. 11-13. FIG. 11 shows a schematic cross-sectional view of a semiconductor structure 1700 according to an embodiment in a stage of a manufacturing process according to an embodiment. For convenience, in FIGS. 1-7, on the one hand, and in FIGS. 11-13, on the other hand, like reference numerals have been used to denote like components. Features denoted by like reference numerals may have corresponding features, and corresponding methods may be used for the formation thereof. Accordingly, a detailed description thereof will sometimes be omitted.

The semiconductor structure 1700 includes a substrate 101. The substrate 101 includes a logic transistor region 102, a ferroelectric transistor region 103 and an input/output transistor region 104. A shallow trench isolation structure 105 provides electrical insulation between the logic transistor region 102, the ferroelectric transistor region 103 and the input/output transistor region 104. Furthermore, the shallow trench isolation structure 105 provides electrical insulation between the logic transistor region 102, the ferroelectric transistor region 103, the input/output transistor region 104 and other circuit elements (not shown) in the semiconductor structure 1700.

Above the logic transistor region 102, a logic transistor dummy gate structure 1701 is provided. Above the ferroelectric transistor region 103, a ferroelectric transistor dummy gate structure 1702 is provided. Above the input/output transistor region 104, an input/output transistor dummy gate structure 1703 is provided. Adjacent the logic transistor dummy gate structure 1701, a source region 1725 and a drain region 1726 are provided in the logic transistor region 102. In the source region 1725 and in the drain region 1726, silicide regions 1731, 1732 may be provided.

Similarly, in the ferroelectric transistor region 103, a source region 1727 and a drain region 1728 including silicide regions 1733, 1734 may be provided, and in the input/output transistor region 104, a source region 1729 and a drain region 1730 including silicide regions 1735, 1736 may be provided.

The logic transistor dummy gate structure 1701 and the ferroelectric transistor dummy gate structure 1702 may each include a gate dielectric 1708, a metal layer 1709 and a gate electrode material 1710. In addition to the gate dielectric 1708, the metal layer 1709 and the gate electrode material 1710, the input/output transistor dummy gate structure 1703 may include an input/output transistor dielectric 1711. The gate dielectric 1708 may include an electrically insulating material, for example, silicon dioxide and/or a high-k dielectric material, such as hafnium dioxide. The gate electrode material 1710 may include a semiconductor material, for example, polysilicon and/or amorphous silicon. In some embodiments, in particular in embodiments wherein the gate dielectric 1708 includes silicon dioxide, the metal layer 1709 may be omitted.

Adjacent the logic transistor dummy gate structure 1701, a sidewall spacer structure 1712 may be provided. Similarly, adjacent the ferroelectric transistor dummy gate structure 1702 and the input/output transistor dummy gate structure 1703, a sidewall spacer structure 1713 and a sidewall spacer structure 1714, respectively, may be provided.

The present disclosure is not limited to embodiments wherein each of the sidewall spacer structures 1712, 1713, 1714 includes a single sidewall spacer, as shown in FIG. 11. In other embodiments, each of the sidewall spacer structures 1712, 1713, 1714 may include a plurality of sidewall spacers that are formed adjacent each other and which may be separated from each other by one or more liner layers. Materials that may be used for forming the sidewall spacer structures 1712, 1713, 1714 include silicon dioxide, silicon nitride and/or silicon oxynitride.

The semiconductor structure 1700 further includes an interlayer dielectric 1716, which may include silicon dioxide, and an etch stop layer 1715, which may include silicon nitride.

The combination of the sidewall spacer structures 1712, 1713, 1714, the etch stop layer 1715 and the interlayer dielectric 1716 provides an electrically insulating structure 1704 that annularly encloses each of the logic transistor dummy gate structure 1701, the ferroelectric transistor dummy gate structure 1702 and the input/output transistor dummy gate structure 1703. Since different materials may be used in the sidewall spacer structures 1712, 1713, 1714, the etch stop layer 1715 and/or the interlayer dielectric 1716, the electrically insulating structure 1704 may have portions formed of different materials.

For forming the above-described features, the substrate 101 including the logic transistor region 102, the ferroelectric transistor region 103 and the input/output transistor region 104, as well as the shallow trench isolation structure 105, may be provided as described above with reference to FIG. 1. Then, a layer of the input/output transistor dielectric 1711 may be formed over the semiconductor structure 1700, and portions of the input/output transistor dielectric 1711 over the logic transistor region 102 and the ferroelectric transistor region 103 may be removed using processes of photolithography and etching.

Then, a layer of the gate dielectric 1708, the metal layer 1709 and a layer of the gate electrode material 1710 may be deposited over the semiconductor structure 1700. Thereafter, the layer of the input/output transistor dielectric 1711, the layer of the gate dielectric 1708, the metal layer 1709 and the layer of the gate electrode material 1710 may be patterned using techniques of photolithography and etching (wherein, optionally, a hard mask (not shown) may be employed) to form the logic transistor dummy gate structure 1701, the ferroelectric transistor dummy gate structure 1702 and the input/output transistor dummy gate structure 1703. Thereafter, the sidewall spacer structures 1712, 1713, 1714 may be formed using techniques of substantially isotropic deposition and anisotropic etching, and ion implantation processes may be performed for forming the source regions 1725, 1727, 1729 and the drain regions 1726, 1728, 1730. The formation of the source regions 1725, 1727, 1729 and the drain regions 1726, 1728, 1730 may include a number of ion implantation processes for introducing dopants into the semiconductor material of the substrate 101, which may be performed before and/or after the formation of the sidewall spacer structures 1712, 1713, 1714, for obtaining a desired dopant profile in the source regions 1725, 1727, 1729 and the drain regions 1726, 1728, 1730. In embodiments wherein each of the sidewall spacer structures 1712, 1713, 1714 includes a plurality of sidewall spacers, ion implantation processes may also be performed after the formation of each of the individual sidewall spacers of the sidewall spacer structures 1712, 1713, 1714.

The silicide regions 1731-1736 may be formed by depositing a layer of a metal, such as, for example, nickel, over the semiconductor structure and performing an annealing process for inducing a chemical reaction between the metal and the semiconductor material of the substrate 101, wherein silicide is formed.

Thereafter, the etch stop layer 1715 and the interlayer dielectric 1716 may be deposited, and a chemical mechanical polishing process may be performed for obtaining a substantially planar surface of the semiconductor structure 1700 and for exposing the logic transistor dummy gate structure 1701, the ferroelectric transistor dummy gate structure 1702 and the input/output transistor dummy gate structure 1703.

The present disclosure is not limited to embodiments wherein the input/output transistor dielectric 1711 is provided only in the input/output transistor dummy gate structure 1703, as shown in FIG. 11. In other embodiments, an input/output transistor dielectric may also be provided below the gate dielectric 1708 of the ferroelectric transistor dummy gate structure 1702. Furthermore, the present disclosure is not limited to embodiments wherein the formation of the silicide regions 1731-1736 is performed at the stage of the manufacturing process illustrated in FIG. 11. In other embodiments, the silicidation performed for forming the silicide regions 1731-1736 may be done after a ferroelectric transistor replacement gate process, that will be described in the following, and/or after further replacement gate processes wherein the logic transistor dummy gate structure 1701 and/or the input/output transistor dummy gate structure 1703 are replaced. In such embodiments, the silicidation may be performed through contact holes formed in the interlayer dielectric 1716 and the etch stop layer 1715. Alternatively, the ferroelectric transistor replacement gate process may be performed after a silicidation through contact holes that is performed for forming the silicide regions 1731-1736.

A ferroelectric transistor replacement gate process may be performed, wherein the ferroelectric transistor dummy gate structure 1702 is replaced by another gate structure wherein a ferroelectric material is provided between the gate electrode and the ferroelectric transistor region 103, and which forms a final gate structure of the ferroelectric transistor formed at the ferroelectric transistor region 103.

The ferroelectric transistor replacement gate process may include a formation of a mask 1717 over the semiconductor structure 1700. The mask 1717 may be a photoresist mask, and it may be formed by means of a photolithography process. The mask 1717 covers the logic transistor region 102 and the input/output transistor region 104, but not the ferroelectric transistor region 103.

After the formation of the mask 1717, one or more etch processes may be performed, as schematically denoted by arrows 1718 in FIG. 11. In the one or more etch processes 1718, the ferroelectric transistor dummy gate structure 1702 may be removed from the semiconductor structure 1700, so that the semiconductor material of the substrate 101 is exposed at the bottom of a recess formed in the electrically insulating structure 1704 created by the removal of the ferroelectric transistor dummy gate structure 1702. Since the recess in the electrically insulating structure 1704 is created by removing the ferroelectric transistor dummy gate structure 1702, the recess is provided at the location of the ferroelectric transistor dummy gate structure 1702. Thus, the semiconductor material exposed at the bottom of the recess in the electrically insulating structure 1704 is arranged between the source region 1727 and the drain region 1728, corresponding to a channel region of the ferroelectric transistor that is to be formed at the ferroelectric transistor region 103.

The one or more etch processes 1718 may include one or more dry etch processes and/or one or more wet etch processes adapted to remove the materials of the gate dielectric 1708, the metal layer 1709 and the gate electrode material 1710. In some embodiments, the one or more etch processes 1718 may include a wet etch process wherein an etchant including diluted hydrofluoric acid is employed for removing the gate dielectric 1708. This may help to obtain a smooth surface of the semiconductor material exposed at the bottom of the recess in the electrically insulating structure 1704 that is formed at the location of the ferroelectric transistor dummy gate structure 1702. In other embodiments, the removal of the gate dielectric 1708 may be omitted, and the gate dielectric 1708 may remain in the semiconductor structure 1700.

Figure 12:
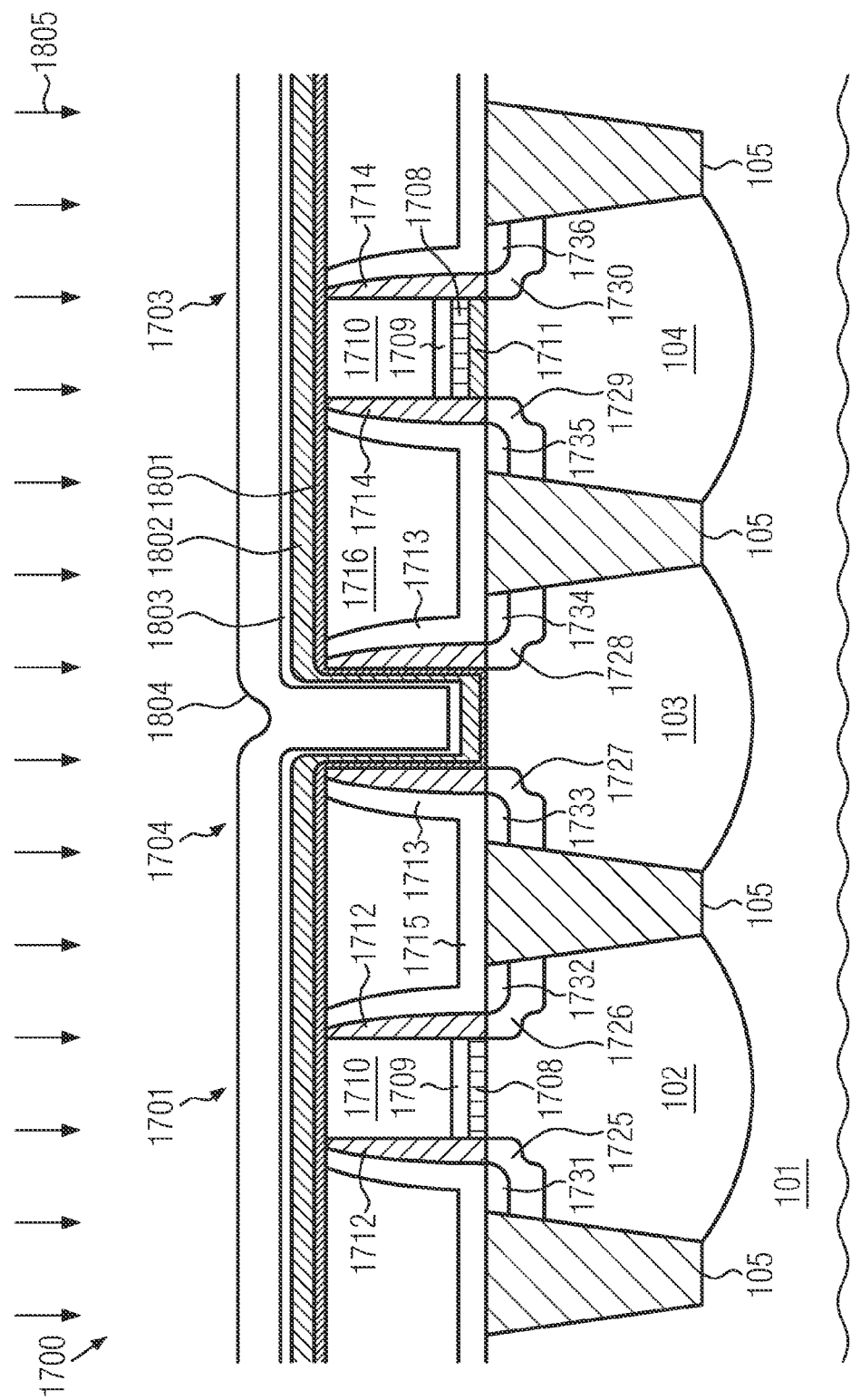

FIG. 12 shows a schematic cross-sectional view of the semiconductor structure 1700 in a later stage of the manufacturing process. After the removal of the ferroelectric transistor dummy gate structure 1702, a base layer 1801 may be deposited on the semiconductor structure 1700. The base layer 1801 may include silicon dioxide and may be formed by means of a deposition process, such as CVD or PECVD. Thereafter, a ferroelectric transistor dielectric 1802 may be deposited over the semiconductor structure 1700. Features of the ferroelectric transistor dielectric 1802, as well as methods employed for depositing the ferroelectric transistor dielectric 1802, may correspond to features of the ferroelectric transistor dielectric 301. In some embodiments, the ferroelectric transistor dielectric 1802 may include substantially pure hafnium dioxide or gadolinium-doped hafnium dioxide. Processes for forming the ferroelectric transistor dielectric 1802 may be performed at temperatures of less than about 500° C. to avoid adverse effects on the silicide regions 1731-1736.

Thereafter, a metal 1803 may be deposited over the semiconductor structure 1700. Features of the metal 1803 and methods used for the deposition of the metal 1803 may correspond to features of the second metal 302 and the methods employed for the formation of the second metal 302 in the embodiments described above. Depending on the target work function of the ferroelectric transistor to be formed at the ferroelectric transistor region 103, the metal 1803 may include a metal typically employed for the adaptation of the work function in N-channel transistors, such as an alloy of titanium and aluminum, or a metal typically employed for the adaptation of the work function in P-channel transistors, such as titanium nitride or tantalum. Thereafter, a gate electrode material 1804 may be deposited over the semiconductor structure 1700. In some embodiments, the gate electrode material 1804 may include one or metals suitable for adapting a work function, and aluminum may be provided on the one or more metals suitable for adapting the work function.

Thereafter, an annealing process may be performed, as schematically denoted by arrows 1805 in FIG. 12. The annealing process 1805 may induce a re-crystallization of the ferroelectric transistor dielectric 1802. In the re-crystallization of the ferroelectric transistor dielectric 1802, which is performed in the presence of the metal 1803 on the ferroelectric transistor dielectric 1802, a crystal structure of the ferroelectric transistor dielectric 1802 having ferroelectric properties may be obtained.

Figure 13:
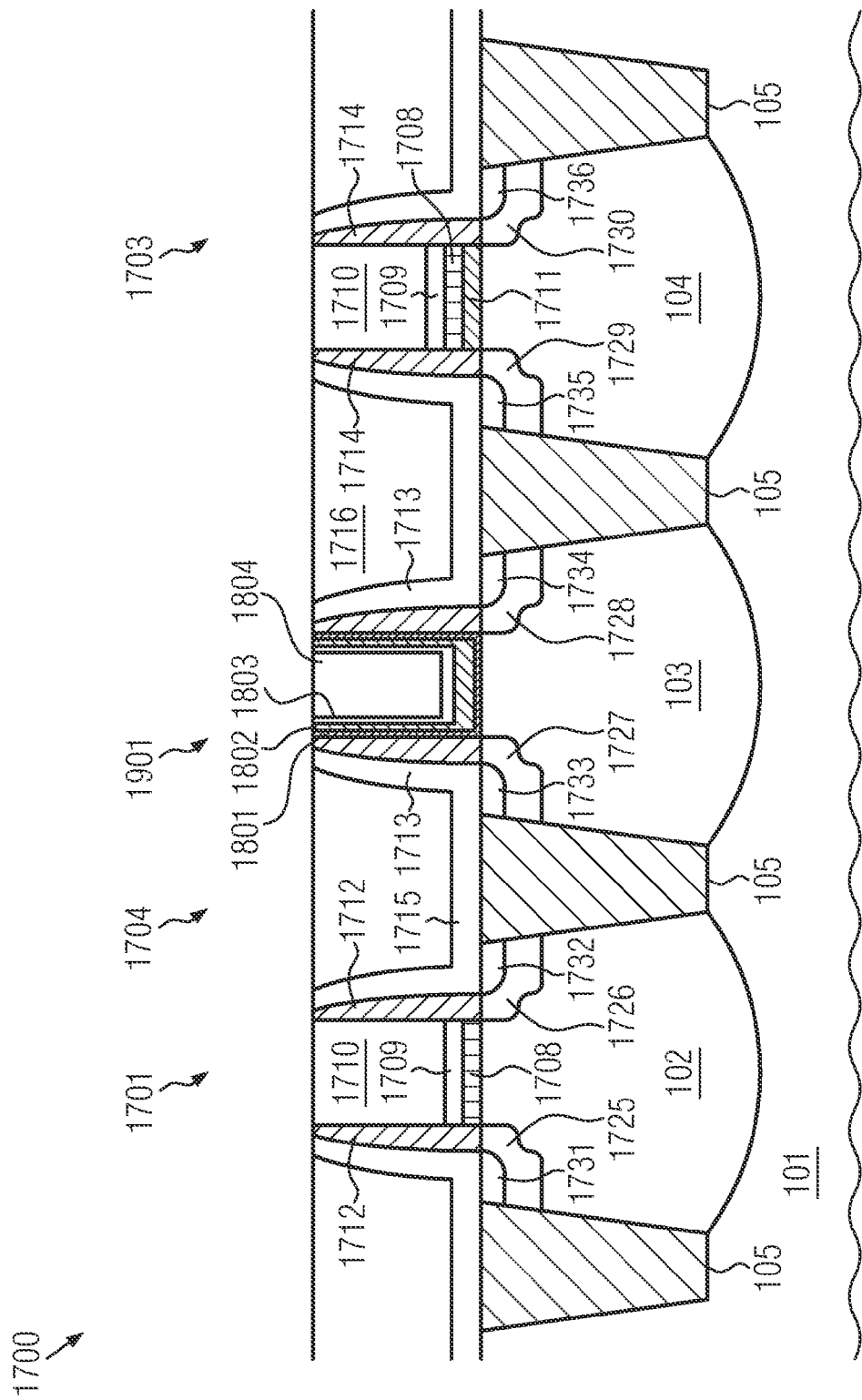

FIG. 13 shows a schematic cross-sectional view of the semiconductor structure 1700 in a later stage of the manufacturing process. A chemical mechanical polishing process may be performed for removing portions of the base layer 1801, the ferroelectric transistor dielectric 1802, the metal 1803 and the gate electrode material 1804 outside the recess in the electrically insulating structure 1704 that was formed by the removal of the ferroelectric transistor dummy gate structure 1702. Portions of the base layer 1801, the ferroelectric transistor dielectric 1802, the metal 1803 and the gate electrode material 1804 in the recess provide a ferroelectric transistor replacement gate 1901, which provides a final gate structure of the ferroelectric transistor formed at the ferroelectric transistor region 103. The ferroelectric transistor replacement gate 1901 includes a gate dielectric provided by the base layer 1801 and the ferroelectric transistor dielectric 1802, and a gate electrode provided by the metal 1803 and the gate electrode material 1804.

Thereafter, a logic transistor replacement gate process may be performed, wherein the logic transistor dummy gate structure 1701 is removed and replaced by a final gate structure of the logic transistor formed at the logic transistor region 102. Furthermore, an input/output transistor replacement gate process may be performed wherein the input/output transistor dummy gate structure 1703 is removed and replaced by a final gate structure of the input/output transistor provided at the input/output transistor region 104. Features of the logic transistor replacement gate process and the input/output transistor replacement gate process may correspond to features of conventional replacement gate processes.

The present disclosure is not limited to embodiments wherein the ferroelectric transistor replacement gate process, the logic transistor replacement gate process and the input/output transistor replacement gate process are performed in the order described above. In other embodiments, the ferroelectric transistor replacement gate process, the logic transistor replacement gate process and the input/output transistor replacement gate process may be performed in a different order. However, performing the ferroelectric transistor replacement gate process first may help to avoid that the final gate electrodes of the logic transistor and the input/output transistor are affected by the annealing process 1804.

Moreover, the present disclosure is not limited to replacement gate processes wherein the entire dummy gate structures 1701, 1702, 1703 are replaced, as described above with reference to FIGS. 11-13. In other embodiments, a ferroelectric transistor replacement gate process, a logic transistor replacement gate process and/or an input/output transistor replacement gate process may be performed wherein only the gate electrodes of the ferroelectric transistor, the logic transistor and/or the input/output transistor are replaced, but no replacement of the dielectric layers below the gate electrodes is performed. In particular, in the case of the ferroelectric transistor, the ferroelectric transistor gate dielectric may be formed before the ferroelectric transistor replacement gate process, using techniques as described above with reference to FIGS. 1-10, and it may remain in the semiconductor structure and form the final gate dielectric of the ferroelectric transistor.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    providing a semiconductor structure comprising a logic transistor region, a ferroelectric transistor region and an input/output transistor region;
    forming an input/output transistor dielectric over at least said input/output transistor region and said logic transistor region;
    removing said input/output transistor dielectric from at least said logic transistor region;
    after removing said input/output transistor dielectric from at least said logic transistor region, depositing a logic transistor dielectric over said semiconductor structure and depositing a first metal over said logic transistor dielectric;
    removing said logic transistor dielectric and said first metal from said ferroelectric transistor region; and
    forming a ferroelectric transistor dielectric over said ferroelectric transistor region.

2. The method of claim 1, wherein said ferroelectric transistor dielectric is formed after the removal of said logic transistor dielectric and said first metal from said ferroelectric transistor region, the formation of said ferroelectric transistor dielectric comprising a deposition of said ferroelectric transistor dielectric over said semiconductor structure.

3. The method of 2, further comprising depositing a second metal over said ferroelectric transistor dielectric.

4. The method of claim 3, further comprising, after depositing said second metal, removing portions of said ferroelectric dielectric and said second metal over said logic transistor region and said input/output transistor region.

5. The method of claim 4, wherein the removal of portions of said ferroelectric dielectric and said second metal over said logic transistor region and said input/output transistor region comprises performing an etch process adapted to selectively remove said ferroelectric dielectric relative to said first metal.

6. The method of claim 4, further comprising:
before the deposition of said ferroelectric transistor dielectric over said semiconductor structure, depositing a protection layer over said semiconductor structure and removing a portion of said protection layer over said ferroelectric transistor region, said portions of said logic transistor dielectric and said first metal over said ferroelectric transistor region, and a portion of said input/output transistor dielectric over said ferroelectric transistor region.

7. The method of claim 6, further comprising forming a first spacer adjacent a portion of said protection layer over said logic transistor region and a second spacer adjacent a portion of said protection layer over said input/output transistor region.

8. The method of claim 6, further comprising removing portions of said protection layer over said logic transistor region and said input/output transistor region.

9. The method of claim 1, wherein said ferroelectric transistor dielectric comprises a layer of silicon-doped hafnium dioxide.

10. The method of claim 9, wherein said ferroelectric transistor dielectric further comprises a base layer comprising at least one of silicon dioxide and silicon nitride, said base layer being provided below said layer of silicon-doped hafnium dioxide.

11. The method of claim 1, further comprising:
forming a first gate electrode over said logic transistor region;
forming a second gate electrode over said input/output transistor region; and
forming a third gate electrode over said ferroelectric transistor region.

* * * * *